United States Patent
Iijima et al.

(10) Patent No.: US 6,632,539 B1
(45) Date of Patent: Oct. 14, 2003

(54) POLYCRYSTALLINE THIN FILM AND METHOD FOR PREPARING THEREOF, AND SUPERCONDUCTING OXIDE AND METHOD FOR PREPARATION THEREOF

(75) Inventors: Yasuhiro Iijima, Tokyo (JP); Mariko Kimura, Tokyo (JP); Takashi Saitoh, Tokyo (JP)

(73) Assignees: Fujikura Ltd., Tokyo (JP); International Superconductivity Technology Center,, Tokyo (JP)

( * ) Notice: Subject to any disclaimer, the term of this patent is extended or adjusted under 35 U.S.C. 154(b) by 0 days.

(21) Appl. No.: 09/890,052

(22) PCT Filed: Nov. 29, 2000

(86) PCT No.: PCT/JP00/08420

§ 371 (c)(1),
(2), (4) Date: Jul. 25, 2001

(87) PCT Pub. No.: WO01/40536

PCT Pub. Date: Jun. 7, 2001

(30) Foreign Application Priority Data

Nov. 29, 1999 (JP) ............................................. 11-338731
May 29, 2000 (JP) ........................................ 2000-159249

(51) Int. Cl.[7] ............................ B32B 15/04; B32B 9/00; H01L 39/24; B05D 5/12
(52) U.S. Cl. ...................... 428/472; 428/699; 428/930; 505/237; 505/238; 505/475; 505/434; 505/731; 427/62
(58) Field of Search ................................ 428/472, 469, 428/701, 702, 699, 930; 505/100, 191, 238, 237, 475, 480, 434, 731, 477; 427/62

(56) References Cited

U.S. PATENT DOCUMENTS 4,916,114 A * 4/1990 Hoenig .................. 427/255.26
5,432,151 A * 7/1995 Russo et al. .............. 427/419.2
5,556,713 A * 9/1996 Leverant ...................... 427/528
5,650,378 A * 7/1997 Iijima et al. ............. 204/192.11
5,872,080 A * 2/1999 Arendt et al. ................ 428/469
5,898,020 A * 4/1999 Goyal et al. ................. 148/320
6,060,433 A * 5/2000 Li et al. ................... 427/419.3
6,140,773 A * 10/2000 Anders et al. .......... 204/192.13
6,190,752 B1 * 2/2001 Do et al. ...................... 428/141
6,214,772 B1 * 4/2001 Iijima et al. ............ 204/192.11
6,256,521 B1 * 7/2001 Lee et al. ...................... 505/230
6,270,908 B1 * 8/2001 Williams et al. ............. 428/469
6,337,307 B1 * 1/2002 Nakahara et al. .......... 174/125.1
6,361,598 B1 * 3/2002 Balachandran et al. ........ 117/84
6,376,090 B1 * 4/2002 Kijima ......................... 428/469
6,399,154 B1 * 6/2002 Williams et al. ............. 427/327
6,440,211 B1 * 8/2002 Beach et al. .................... 117/9
6,451,450 B1 * 9/2002 Goyal et al. ................. 148/512

FOREIGN PATENT DOCUMENTS

| JP | 3-252313 | 11/1991 | |
|---|---|---|---|
| JP | 4-65397 | 3/1992 | |
| JP | 6-145977 | 5/1994 | |
| JP | 6-271393 | 9/1994 | |
| JP | 9-67193 | 3/1997 | |
| JP | WO98/17846 | * 4/1998 | ........... C30B/28/00 |
| JP | 11-49599 | 2/1999 | |

* cited by examiner

Primary Examiner—Tom Dunn
Assistant Examiner—Colleen P. Cooke
(74) Attorney, Agent, or Firm—Bell, Boyd & Lloyd LLC

(57) ABSTRACT

The polycrystalline thin film is made of a composite oxide of a cubic crystal system which has a pyrochlore type crystalline structure of a composition represented as either AZrO or AHfO (A in the formula represents a rare earth element selected from among Y, Yb, Tm, Er, Ho, Dy, Eu, Gd, Sm, Nd, Pr, Ce and La) formed on the film forming surface of the polycrystalline substrate, wherein the grain boundary misalignment angle between the same crystal axes of different crystal grains in the polycrystalline thin film along a plane parallel to the film forming surface of the polycrystalline substrate are controlled within 30°.

31 Claims, 14 Drawing Sheets

$Sm_2Zr_2O_7$

SUBSTRATE TEMPERATURE     200°C
ASSISTING BEAM     $Ar^+$ 200eV
WITHIN PLANE     FWHM=17.1°

--o-- YSZ (111)

--□-- $HfO_2$ (111)

--+-- $CeO_2$ (111)

--×-- $Y_2O_3$ (222)

—△— $Zr_2Sm_2O_7$ (222)

—▲— $Zr_2Gd_2O_7$ (222)

US 6,632,539 B1

POLYCRYSTALLINE THIN FILM AND METHOD FOR PREPARING THEREOF, AND SUPERCONDUCTING OXIDE AND METHOD FOR PREPARATION THEREOF

TECHNICAL FIELD

The present invention relates to a polycrystalline thin film having a pyrochlore type crystalline structure with well-aligned crystal orientation and a method of producing the same, and an oxide superconductor element of excellent superconducting property comprising an oxide superconducting layer formed on the polycrystalline thin film which has a pyrochlore type crystalline structure with well-aligned crystal orientation, and a method of producing the same.

BACKGROUND ART

The oxide superconducting materials which have been discovered in recent years are good superconducting materials that have critical temperatures above the temperature of liquid nitrogen However, there remain various problems to be solved before the oxide superconducting materials can be used as practical superconductors. One of the problems is the low critical current densities of the oxide superconducting materials.

The problem that the critical current density of the oxide superconducting material is low stems mainly from the electrical anisotropy which is intrinsic to the crystal of the oxide superconducting material. It is known that electric conductivity of the oxide superconducting material is high in the a-axis and b-axis directions of the crystal, but is low in the c-axis direction. Thus, in order to use an oxide superconducting layer formed on a substrate as a superconductor element, it is necessary to form an oxide superconducting layer of good crystal orientation on the substrate and to align the a-axis or b-axis of the crystal of the oxide superconducting material to the intended direction of current flow, while aligning the c-axis of the oxide superconducting material to the other direction.

Accordingly, a practice has been employed such that an intermediate layer having good crystal orientation made of MgO, $SrTiO_3$ or the like is formed on a substrate such as a metal tape by means of a sputtering apparatus, and an oxide superconducting layer is formed on the intermediate layer. However, the oxide superconducting layer formed on an intermediate layer of this type by a sputtering apparatus has a critical current density (typically about 1000 to 10000 $A/cm^2$) which is far lower than that of the oxide superconducting layer (typically several hundred thousands of $A/cm^2$) which is formed on a single crystal substrate made of such a material. The cause of this problem is supposedly as follows.

FIG. 16 is a sectional view of an oxide superconductor element made by forming an intermediate layer 2 on a substrate 1 made of a polycrystalline material in the form of a metal tape or the like by means of a sputtering apparatus, and then forming an oxide superconducting layer 3 on the intermediate layer 2 by the sputtering apparatus. In the structure shown in FIG. 16, the oxide superconducting layer 3 is in a polycrystalline state in which a multitude of crystal grains 4 are bonded together in a random manner. These crystal grains 4 individually show the c-axis of crystal being oriented somewhat perpendicularly to the substrate surface, but the a-axis and b-axis are randomly oriented.

When the a-axis and b-axis are randomly oriented among the crystal grains of the oxide superconducting layer, degradation in the superconducting properties, particularly in the critical current density, would be caused due to quantum coupling of the superconducting state being lost in the grain boundaries in which crystal orientation is disturbed.

The cause of the oxide superconductor element turning into a polycrystalline state with the a-axis and b-axis randomly oriented is supposedly as follows: since the intermediate layer 2 formed below the oxide superconducting layer is polycrystalline where the a-axis and b-axis are randomly oriented, the oxide superconducting layer 3 would be grown in such a condition as to match the crystal structure of the intermediate layer 2.

The present inventors found that an oxide superconductor element having a sufficient critical current density can be produced by forming an intermediate layer of YSZ (yttrium-stabilized zirconia) which has well-oriented a-axis and b-axis on a polycrystalline substrate by means of a special process, and forming an oxide superconducting layer on the intermediate layer. With respect to this technology, the present inventors have filed applications by way of Japanese Patent Application No. Hei 4-293464, Japanese Patent Application No. Hei 8-214806, Japanese Patent Application No. Hei 8-272606, and Japanese Patent Application No. Hei 8-272607.

The technology proposed in these patent applications makes it possible to, when a film is formed on a polycrystalline substrate using a target made of YSZ, selectively remove YSZ crystals of unfavorable crystal orientation by means of an ion beam-assisted process in which the film forming surface of the polycrystalline substrate is irradiated in an oblique direction at an incident angle from 50 to 60° with a beam of ions such as $Ar^+$ thereby to selectively deposit YSZ crystals of good crystal orientation, so that an intermediate layer of YSZ crystal having good crystal orientation is formed.

According to the technology proposed in the previous applications of the present inventors, a polycrystalline thin film of YSZ with the a-axis and b-axis being favorably oriented can be formed. Also it was verified that the oxide superconducting layer formed on the polycrystalline thin film has a sufficient critical current density, and the inventors of the present application commenced research to develop a technology for producing polycrystalline thin films having more favorable properties than other materials.

FIG. 17 is a sectional view showing an example of the oxide superconductor element which the inventor shave been using recently. The oxide superconductor element D of this example has a four-layer structure made by forming, with the ion beam-assisted technology described previously, an orientation control intermediate layer 6 made of YSZ or MgO on a substrate 5 in the form of metal tape, then forming a reaction stopper intermediate layer 7 made of $Y_2O_3$ thereon and forming the oxide superconducting layer 8 thereon.

The reason for using the four-layer structure is that, in order to form an oxide superconducting layer having a composition of $Y_1Ba_2Cu_3O_{7-x}$, it is necessary to apply a heat treatment at a temperature in a range from 600 to 800° C. after forming the oxide superconducting layer which has the desired composition by sputtering or other film forming process, but diffusion of elements may proceed between the oxide superconducting layers that have the compositions of $Y_1Ba_2Cu_3O_{7-x}$ and YSZ, due to the heat supplied during the heat treatment, while the diffusion may cause deterioration of the superconducting property and must be prevented. The YSZ crystal which constitutes the orientation control intermediate layer 6 has a cubic crystal structure, and the oxide superconducting layer having the composition of $Y_1Ba_2Cu_3O_{7-x}$ has a crystal structure called perovskite. Both of these crystal structures belong to a class of face-centered cubic crystals and have similar crystal lattices, but there exists a difference of about 5% in the lattice size between the two structures. For example, distance between nearest atoms, namely the distance between an atom located at a corner of the cubic lattice and an atom located at the center of the face of the cubic lattice is 3.63 Å (0.363 nm) in the case of YSZ, 3.75 Å (0.375 nm) in the case of $Y_2O_3$, and is 3.81 Å (0.381 nm) in the case of the oxide superconducting layer having the composition of $Y_1Ba_2Cu_3O_{7-x}$. Thus $Y_2O_3$ has an intermediate value between those of YSZ and $Y_1Ba_2Cu_3O_{7-x}$ and is useful for bridging the difference in lattice size and can be advantageously used as a reaction stopper layer due to the similarity in the compositions.

With the four-layer structure shown in FIG. 17, however, the number of required layers is increased, which leads to a problem of increased number of production processes.

Through research to form a film of well-oriented crystal structure, made of a material which has a value of distance between nearest atoms nearer to that of the oxide superconductor than YSZ, directly on the metal tape substrate 5, the present inventors have completed the present invention.

Meanwhile techniques to form various films of good orientation on polycrystalline substrates have been used in fields other than the application of the oxide superconducting material, such as the optical thin film, magneto-optical disk, circuit wiring board, high-frequency waveguide, high-frequency filter and cavity resonator. In any of these fields, it remains a challenge to form a favorably oriented polycrystalline thin film of stable film quality on a substrate. A polycrystalline thin film having satisfactory crystal orientation would make it possible to improve the quality of an optical thin film, a magnetic film or thin film for circuit wiring to be formed thereon. Furthermore, it will be more preferable to be capable of forming the optical thin film, magnetic thin film, or thin film for circuit wiring, which has satisfactory crystal orientation, directly on the substrate.

DISCLOSURE OF THE INVENTION

The present invention has been made to solve the problems described above, and has been completed after intensively researching methods for forming a polycrystalline layer having favorable crystal orientation on a substrate by applying the ion beam assisted technology which the present inventors had previously proposed, and an object of the present invention is to obtain a polycrystalline thin film of composite oxide having good crystal orientation and distance between nearest atoms similar to the distance between nearest atoms of an oxide superconducting material formed on the film forming surface of a substrate.

Another object of the present invention is to provide a production method capable of forming such a polycrystalline thin film of good crystal orientation at high speed, and a method of producing a polycrystalline thin film of improved crystal orientation.

Still another object of the present invention is to provide an oxide superconductor element which has a high critical current density and high stability by forming an oxide superconducting layer on the polycrystalline thin film.

In order to achieve the objects described above, the polycrystalline thin film of the present invention is made of a composite oxide having a pyrochlore type crystalline structure of a composition represented as either AZrO or AHfO (A in the formula represents a rare earth element selected from among Y, Yb, Tm, Er, Ho, Dy, Eu, Gd, Sm, Nd, Pr, Ce and La) being formed on the film forming surface of a polycrystalline substrate, wherein the grain boundary inclination angles (the grain boundary misalignment angle), between the same crystal axes of different crystal grains in the polycrystalline thin film along the plane parallel to the film forming surface of the polycrystalline substrate, are controlled within 30°.

In the polycrystalline thin film of the composite oxide having a pyrochlore type crystalline structure of composition represented as either AZrO or AHfO, the rare earth element and Zr or Hf may be included in a relative proportion of 1:1.

The rare earth element and Zr or Hf which constitute the polycrystalline thin film of the composite oxide that is made mainly of a pyrochlore type crystalline structure of a composition represented as either AZrO or AHfO may be included therein in a relative proportion in a range from 0.1:0.9 to 0.9:0.1, and may be of a cubic crystal system. In this case, the crystal structure is not necessarily of a pyrochlore type, and may also have a similar structure called the omission fluorite type or the type C rare earth, which is valid as long as the cubic crystal system is maintained.

In the constitution described above, the polycrystalline substrate can be formed from a heat resistant metal tape made of a Ni alloy or the like, and the polycrystalline thin film can be formed from $Sm_2Zr_2O_7$ or $Gd_2Zr_2O_7$.

In the polycrystalline thin film of the constitution described above, the grain boundary inclination angles (the grain boundary misalignment angle), between the same crystal axes of different crystal grains in the polycrystalline thin film along the plane parallel to the film forming surface of the polycrystalline substrate, are preferably controlled within 200 and more preferably may be controlled within 100

In order to achieve the object described above, the present invention provides a method of producing the polycrystalline thin film comprising crystal grains of composite oxide having a pyrochlore type crystal structure of a composition represented by one of formulas AZrO and AHfO (A in the formula represents a rare earth element selected from among Y, Yb, Tm, Er, Ho, Dy, Eu, Gd, Sm, Nd, Pr, Ce and La) being formed on the film forming surface of a polycrystalline substrate, with the grain boundary inclination angles(the grain boundary misalignment angle) between the same crystal axes of different crystal grains along the plane parallel to the surface of the polycrystalline substrate whereon the film is to be formed are controlled within 30 degrees, wherein the polycrystalline substrate is heated to a temperature within 300° C. and an ion beam of $Ar^+$ ions, $Kr^+$ ions, or $Xe^+$ ions, or a mixed beam of these ions is generated from an ion source with the energy of the ion beam being set in a range from 150 eV to 300 eV, while the incident angle of the ion beam irradiating the substrate is set in a range from 50 to 60° from the normal line of the film forming surface thereof, when depositing the particles generated from a target, which is made of the same elements as those of the polycrystalline thin film, on the polycrystalline substrate.

In the method of producing the polycrystalline thin film of the composition described above, the energy of the ion beam generated from the ion source is preferably controlled in a range from 175 eV to 225 eV, and more preferably at 200 eV when depositing the particles, generated from the target made of the same elements as those of the polycrystalline thin film, on the polycrystalline substrate.

In the method of producing the polycrystalline thin film of the composition described above, the ion beam irradiating the substrate is set in a range from 55 to 60° from the normal line of the film forming surface thereof, and more preferably at 55° from the normal line of the film forming surface when depositing the particles generated from a target, which is made of the same elements as those of the polycrystalline thin film, on the polycrystalline substrate.

Also in the method of producing the polycrystalline thin film of the composition described above, it is preferable that the polycrystalline substrate be heated to a temperature of 200° C. and an ion beam of $Ar^+$ ions, $Kr^+$ ions, or $Xe^+$ ions or a mixture of these ions is generated from the ion source with the energy of the ion beam being controlled to 200 eV, while the ion beam is applied to irradiate the substrate at an incident angle of 55° from the normal line of the film forming surface thereof, when depositing the particles generated from the target, which is made of the same elements as those of the polycrystalline thin film, on the polycrystalline substrate.

In order to achieve the object described above, the present invention provides an oxide superconductor element comprising the polycrystalline substrate, the polycrystalline thin film, which is made of oxide crystal grains of composite oxide having a pyrochlore type crystal structure of composition represented by one of formulas AZrO and AHfO (A in the formula represents a rare earth element selected from among Y, Yb, Tm, Er, Ho, Dy, Eu, Gd, Sm, Nd, Pr, Ce and La) being formed on the film forming surface of the polycrystalline substrate with the grain boundary inclination angles(the grain boundary misalignment angle) between the same crystal axes of different crystal grains along the plane parallel to the surface of the polycrystalline substrate whereon the film is to be formed being controlled within 300 and an oxide superconducting layer formed on the polycrystalline thin film.

In the oxide superconductor element having the constitution described above, the oxide superconducting layer may also be made of an oxide superconducting material of a composition represented by one of formulas $A_1Ba_2Cu_3O_{7-X}$ and $A_2Ba_4Cu_8O_X$, (A in the formula represents a rare earth element selected from among Y, Yb, Tm, Er, Ho, Dy, Eu, Gd, Sm, Nd, Pr, Ce and La), or a superconducting material of a cubic crystal system having another composition.

In the oxide superconductor element having the constitution described above, a heat resistant metal tape can be used as the polycrystalline substrate.

In the oxide superconductor element having the constitution described above, the grain boundary inclination angles(the grain boundary misalignment angle), between the same crystal axes of different crystal grains in the oxide superconducting layer along the plane parallel to the film forming surface of the polycrystalline substrate, may be controlled within 30°.

In order to achieve the object described above, the present invention provides a method of producing an oxide superconductor element comprising the polycrystalline substrate, the polycrystalline thin film made up of crystal grains of composite oxide having pyrochlore type crystal structure of composition represented by one of formulas AZrO and AHfO (A in the formula represents a rare earth element selected from among Y, Yb, Tm, Er, Ho, Dy, Eu, Gd, Sm, Nd, Pr, Ce and La) being formed on the film forming surface of the polycrystalline substrate, with the grain boundary inclination angles (the grain boundary misalignment angle) between the same crystal axes of different crystal grains along the plane parallel to the surface of the polycrystalline substrate whereon the film is to be formed are controlled within 30°, and the oxide superconducting layer formed on the polycrystalline thin film, wherein the polycrystalline substrate is heated to a temperature not higher than 300° C. and an ion beam of $Ar^+$ ions, $Kr^+$ ions, or $Xe^+$ ions or a mixture of these ions is generated from an ion source with the energy of the ion beam being set in a range from 150 eV to 300 eV, while the incident angle of the ion beam irradiating the substrate is set in a range from 50 to 60° from the normal line of the film forming surface thereof, when depositing the particles generated from a target, which is made of the same elements as those of the polycrystalline thin film, on the polycrystalline substrate, and thereafter forming the oxide superconducting layer formed on the polycrystalline thin film.

The polycrystalline thin film of pyrochlore type crystal structure formed on the polycrystalline substrate is considered to be more advantageous than the conventional polycrystalline thin film of YSZ with many respects when a superconducting layer made of an oxide is formed thereon.

First, the lattice constant of $ZrO_2$ which is the main component of the YSZ crystal is 5.14 Å (0.514 nm) and, assuming that the distance between an atom located at the center of a face of the face-centered cubic lattice of $ZrO_2$ and an atom located at a corner of the face (distance between nearest atoms) in the face-centered cubic lattice of $ZrO_2$ is 3.63 Å (0.363 nm), then the lattice constant of $Sm_2Zr_2O_7$ crystal is 10.59 Å (1.059 nm) and the distance between nearest atoms is 3.74 Å (0.374 nm). Taking into account the fact that the distance between nearest atoms of oxide superconducting material having the composition of $Y_1Ba_2Cu_3O_{7-X}$ is 3.81 Å (0.381 nm), the polycrystalline thin film made of $Sm_2Zr_2O_7$ composite oxide is considered to be more advantageous with respect to the crystal matching than the polycrystalline thin film of YSZ. That is, when depositing the atoms of the polycrystalline thin film by the ion beam assisted process, normal deposit of atoms would be more easily achieved by using a material having a smaller value of distance between nearest atoms. Also, because $Sm_2Zr_2O_7$ has the crystal structure of the pyrochlore type, a material having pyrochlore type crystal structure represented by one of formulas $Gd_2Zr_2O_7$ (distance between nearest atoms 3.72 Å (0.372 nm)), $La_2Zr_2O_7$ (distance between nearest atoms 3.81 Å (0.381 nm)), $Ce_2Zr_2O_7$ (distance between nearest atoms 3.78 Å (0.378 nm)), $Pr_2Zr_2O_7$ (distance between nearest atoms 3.78 Å (0.378 nm)), $Gd_2Hf_2O_7$ (distance between nearest atoms 3.72 Å (0.372 nm)), $Sm_2Hf_2O_7$ (distance between nearest atoms 3.74 Å (0.374 nm)) and $La_2Hf_2O_7$ (distance between nearest atoms 3.81 Å (0.381 nm)) may be used.

As other materials which have a pyrochlore type crystal structure, materials represented by formulas $Y_2Zr_2O_7$, $Yb_2Zr_2O_7$, $Tm_2Zr_2O_7$, $Er_2Zr_2O_7$, $Ho_2Zr_2O_7$, $Dy_2Zr_2O_7$, $Eu_2Zr_2O_7$, $Nd_2Zr_2O_7$, $Y_2Zr_2O_7$, $Y_2Hf_2O_7$, $Yb_2Hf_2O_7$, $Tm_2Hf_2O_7$, $Er_2Hf_2O_7$, $Ho_2Hf_2O_7$, $DY_2Hf_2O_7$, $EU_2Hf_2O_7$, $Nd_2Hf_2O_7$, $Pr_2Hf_2O_7$, and $Ce_2Hf_2O_7$ may also be used.

The rare earth element and Zr or Hf which constitute the polycrystalline thin film of the pyrochlore type crystalline structure may be included therein in a relative proportion in a range from 0.1:0.9 to 0.9:0.1, instead of 1:1. In this case, the crystal structure is not necessarily of a pyrochlore type, audit may also have a similar structure called the omission fluorite type or the type C rare earth, which is valid as long as the cubic crystal system is maintained.

According to the present invention, the polycrystalline thin film comprising pyrochlore type crystal grains such as AZrO, AHfO or the like of good crystal orientation which is formed on the polycrystalline substrate with the grain boundary inclination angles(the grain boundary misalignment angle) being controlled within 30 degrees, and a polycrystalline thin film of pyrochlore type such as SmZrO having good crystal orientation is preferably used as a base layer for various thin films to be formed thereon, and makes it possible to achieve good superconducting property in the case in which the thin film to be formed is a superconducting layer, achieve good optical property in the case in which the thin film to be formed is an optical thin film, achieve good magnetic property in the case in which the thin film to be formed is a magnetic thin film, and obtain a thin film of lower wiring resistance and fewer defects in the case in which the thin film to be formed is used for circuit wiring.

As the other pyrochlore type composite oxide used for the polycrystalline thin film described above, a composite oxide represented by one of the formulas $Gd_2Zr_2O_7$, $La_2Zr_2O_7$, $Ce_2Zr_2O_7$, $Pr_2Zr_2O_7$, $Gd_2Hf_2O_7$, $Sm_2Hf_2O_7$ and $La_2Hf_2O_7$ may be used, or a composite oxide represented by one of the formulas $Y_2Zr_2O_7$, $Yb_2Zr_2O_7$, $Tm_2Zr_2O_7$, $Er_2Zr_2O_7$, $Ho_2Zr_2O_7$, $Dy_2Zr_2O_7$, $Eu_2Zr_2O_7$, $Nd_2Zr_2O_7$, $Y_2Zr_2O_7$, $Y_2Hf_2O_7$, $Yb_2Hf_2O_7$, $Tm_2Hf_2O_7$, $Er_2Hf_2O_7$, $Ho_2Hf_2O_7$, $Dy_2Hf_2O_7$, $Eu_2Hf_2O_7$, $Nd_2Hf_2O_7$, $Pr_2Hf_2O_7$ and $Ce_2Hf_2O_7$ may also be used.

A heat resistant metal tape made of an Ni alloy may be used as the polycrystalline substrate of the present invention, and a metal tape with the polycrystalline thin film comprising the pyrochlore type crystal grains formed thereon can be made.

According to the present invention, when particles of the target made of pyrochlore type composite oxide having a composition represented by one of formulas AZrO and AHfO (A in the formula represents a rare earth element selected from among Y, Yb, Tm, Er, Ho, Dy, Eu, Gd, Sm, Nd, Pr, Ce and La) are deposited on the polycrystalline substrate, the substrate is controlled to a temperature within 300° C., the energy of the ion beam is set in a range from 150 eV to 300 eV, and the incident angle of the ion beam irradiating on the substrate is set in a range from 50 to 60° from the normal direction of the film forming surface, and therefore it becomes possible to form the polycrystalline thin film of the pyrochlore type composite oxide with good crystal orientation with favorable grain boundary inclination angles (the grain boundary misalignment angle), which has been impossible in the prior art.

When the oxide superconducting layer is formed on the polycrystalline thin film of the pyrochlore type composite oxide having composition represented by one of formulas AZrO and AHfO (A in the formula represents a rare earth element selected from among Y, Yb, Tm, Er, Ho, Dy, Eu, Gd, Sm, Nd, Pr, Ce and La) which has good crystal orientation as described above, the oxide superconducting layer having good crystal orientation can be formed, and therefore, a oxide superconducting layer having a high critical current density and a high critical current can be made. This is because the polycrystalline thin film of the pyrochlore type composite oxide has better crystal matching characteristic with the oxide superconducting layer than the polycrystalline thin film of YSZ does, and this makes it possible to obtain the oxide superconducting layer having better crystal orientation than in the case of using the polycrystalline thin film of YSZ.

Moreover, the polycrystalline thin film of the pyrochlore type composite oxide of better crystal orientation can be made in a shorter period of time by the production method of the present invention than the YSZ polycrystalline thin film which the present inventors previously proposed.

BEST MODES FOR CARRYING OUT THE INVENTION

Now, a preferred embodiment of the present invention will be described below with reference to the accompanying drawings.

Figure 1:
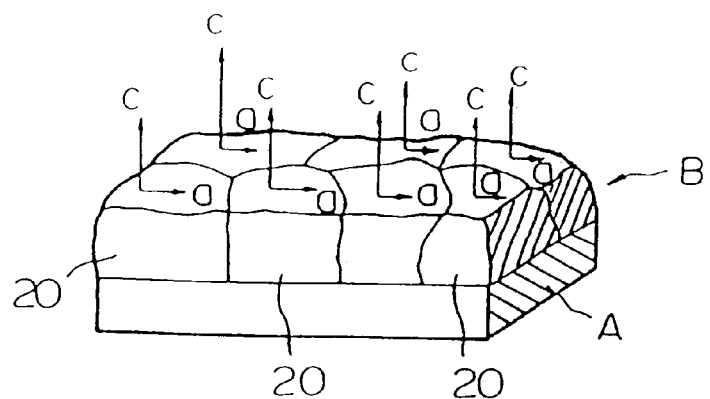
FIG. 1 is a partially cutaway perspective view of an example of polycrystalline thin film of a pyrochlore type composite oxide formed on a substrate by the method of the present invention.

FIG. 1 shows an embodiment in which the polycrystalline thin film of the present invention is formed on a substrate, where A indicates a polycrystalline substrate made in the form of a tape, and B indicates the polycrystalline thin film formed on the top surface of the polycrystalline substrate A.

The polycrystalline substrate A may be made in various forms such as a sheet, wire, or tape. The polycrystalline substrate A is made of a metal or an alloy such as silver, platinum, stainless steel, copper, Hastelloy or other Ni alloy, or heat resistant non-metallic material such as glass or ceramics.

The polycrystalline thin film B of this embodiment is formed from numerous fine crystal grains 20 having pyrochlore type crystal structure of cubic system represented by formula $Sm_2Zr_2O_7$ which are bonded together at the grain boundaries, with the c-axis of each crystal grain 20 being aligned perpendicular to the top surface of the substrate A (surface whereon the film is to be formed), while the a-axes, and also the b-axis, of the individual crystal grains 20 are oriented in the same direction and are aligned along the substrate surface. The c-axis of each crystal grain 20 is also aligned perpendicular to the surface of the polycrystalline substrate A whereon the film is to be formed (top surface). The grains are bonded together so that the angle (grain boundary misalignment angle K shown in FIG. 2) between the a-axes (b-axes) of different crystal grains 20 is constrained within 30 degrees, for example in a range from 15 to 25°.

As the pyrochlore type composite oxide which constitutes the crystal grains 20 described above, composite oxides having compositions of $Gd_2Zr_2O_7$, $La_2Zr_2O_7$, $Ce_2Zr_2O_7$, $Pr_2Zr_2O_7$, $Gd_2Hf_2O_7$, $Sm_2Hf_2O_7$ and $La_2Hf_2O_7$ can be used in addition to $Sm_2Zr_2O_7$.

Also a pyrochlore type composite oxide represented by one of the formulas $Y_2Zr_2O_7$, $Yb_2Zr_2O_7$, $Tm_2Zr_2O_7$, $Er_2Zr_2O_7$, $Ho_2Zr_2O_7$, $Dy_2Zr_2O_7$, $Eu_2Zr_2O_7$, $Nd_2Zr_2O_7$, $Y_2Zr_2O_7$, $Y_2Hf_2O_7$, $Yb_2Hf_2O_7$, $Tm_2Hf_2O_7$, $Er_2Hf_2O_7$, $Ho_2Hf_2O_7$, $Dy_2Hf_2O_7$, $Eu_2Hf_2O_7$, $Nd_2Hf_2O_7$, $Pr_2Hf_2O_7$ and $Ce_2Hf_2O_7$ may also be used.

Figure 3:
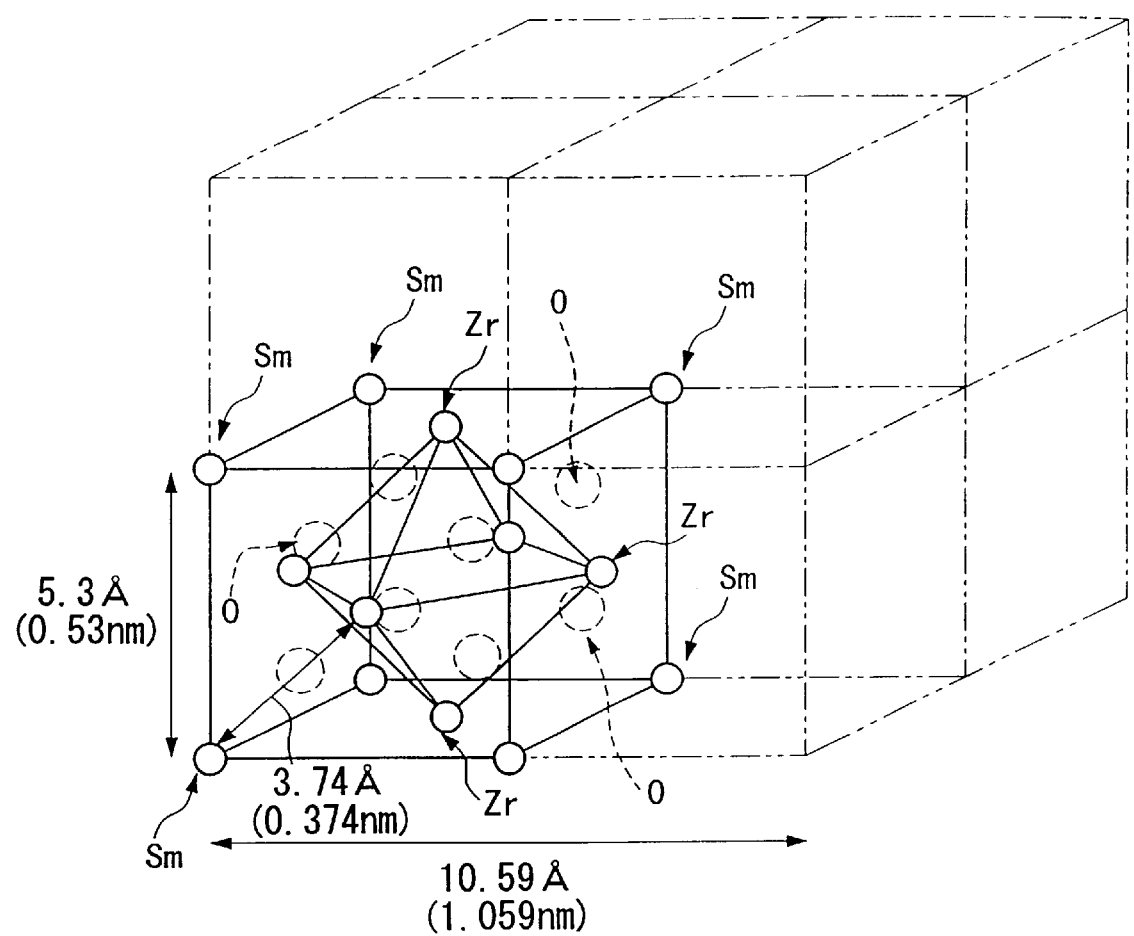
FIG. 3 is a schematic diagram showing the crystal lattice of the pyrochlore type polycrystalline thin film having a composition of $Sm_2Zr_2O_7$.

While the crystal lattice of the pyrochlore type composite oxide is derived from $CaF_2$ structure of a cubic system, and has such a structure as, when eight unit lattices of a face-centered cubic structure as shown in FIG. 3, are disposed one on another in the longitudinal(high), lateral and depth directions, only one of the eight oxygen atoms O (located at positions indicated by circles drawn in dashed line in FIG. 3), which have been included interstitially between the lattices constituted from Sm atoms located at the corners of the unit lattice and Zr atoms located at the center of face of the unit lattice, is removed so as to form an octant, either type I octant or type II octant, depending on the location of the oxygen atom which comes out. The pyrochlore type crystal lattice is considered to be a regular arrangement of the type I octant and the type II octant.

Therefore, while a block of eight unit lattices stacked one on another is regarded as a unit cell in the field of X-ray analysis, the lattice constant of the unit cell is 10.59, while the width of the lattice as the unit lattice is 5.3 Å (0.53 nm) and the distance between nearest atoms is 3.74 Å (0.374 nm).

As the pyrochlore type composite oxide used in the present invention, in addition to $Sm_2Zr_2O_7$, any of $Gd_2Zr_2O_7$ (distance between nearest atoms is 3.72 Å (0.372 nm), lattice constant is 10.52), $La_2Zr_2O_7$ (distance between nearest atoms is 3.81 Å (0.381 nm), lattice constant is 10.79), $Ce_2Zr_2O_7$ (distance between nearest atoms is 3.78 Å (0.378 nm), lattice constant is 10.7), $Pr_2Zr_2O_7$ (distance between nearest atoms is 3.78 Å (0.378 nm), lattice constant is 10.69), $Gd_2Hf_2O_7$ (distance between nearest atoms is 3.72 Å (0.372 nm), lattice constant is 5.29), $Sm_2Hf_2O_7$ (distance between nearest atoms is 3.74 Å (0.374 nm), lattice constant is 5.29), and $La_2Hf_2O_7$ (distance between nearest atoms is 3.81 Å (0.381 nm), lattice constant is 10.77) can be used. Among these composite oxides, $Gd_2Hf_2O_7$ has a lattice constant of 5.26 and $Sm_2Hf_2O_7$ has a lattice constant of 5.29, both supposedly have symmetry having being modified due to the loss of regularity of the structure which includes the hole voids of oxygen atoms, although $Gd_2Hf_2O_7$ and $Sm_2Hf_2O_7$ may be used for the purpose of the present invention, as a matter of fact, in view of the values of distance between nearest atoms thereof.

Based on similar considerations, other pyrochlore type composite oxides which can be used are any of $Y_2Zr_2O_7$ (distance between nearest atoms is 3.67 Å (0.367 nm), lattice constant is 5.19), $Yb_2Zr_2O_7$ (distance between nearest atoms is 3.66 Å (0.366 nm), lattice constant is 5.17), $Tm_2Zr_2O_7$ (distance between nearest atoms is 3.66 Å (0.366 nm), lattice constant is 5.17), $Er_2Zr_2O_7$ (distance between nearest atoms is 3.67 Å (0.367 nm), lattice constant is 5.19), $Ho_2Zr_2O_7$ (distance between nearest atoms is 3.68 Å (0.368 nm), lattice constant is 5.2), $Dy_2Zr_2O_7$ (distance between nearest atoms is 3.68 Å (0.368 nm), lattice constant is 5.21), $Eu_2Zr_2O_7$ (distance between nearest atoms is 3.72 Å (0.372 nm), lattice constant is 10.53), $Nd_2Zr_2O_7$ (distance between nearest atoms is 3.77 Å (0.377 nm), lattice constant is 10.65), $Y_2Hf_2O_7$ (distance between nearest atoms is 3.68 Å (0.368 nm), lattice constant is 5.2), $Yb_2Hf_2O_7$ (distance between nearest atoms is 3.66 Å (0.366 nm), lattice constant is 5.17), $Tm_2Hf_2O_7$ (distance between nearest atoms is 3.66 Å (0.366 nm), lattice constant is 5.17), $Er_2Hf_2O_7$ (distance between nearest atoms is 3.67 Å (0.367 nm), lattice constant is 5.19), $Ho_2Hf_2O_7$ (distance between nearest atoms is 3.68 Å (0.368 nm), lattice constant is 5.21), $Dy_2Hf_2O_7$ (distance between nearest atoms is 3.69 Å (0.369 nm), lattice constant is 5.22), $Eu_2Hf_2O_7$ (distance between nearest atoms is 3.73 Å (0.373 nm), lattice constant is 5.27), $Nd_2Hf_2O_7$ (distance between nearest atoms is 3.76 Å (0.376 nm), lattice constant is 5.32), $Pr_2Hf_2O_7$ (distance between nearest atoms is 3.78 Å (0.378 nm), lattice constant is 10.69), and $Ce_2Hf_2O_7$ (distance between nearest atoms is 3.78 Å (0.378 nm), lattice constant is 10.7).

When depositing the unit lattice of the composite oxide crystal by the ion beam-assisted process under conditions to be described later, an important factor is the distance between nearest atoms which is preferably near the distance between nearest atoms of 3.81 Å (0.381 nm) among the lattice constant 3.81 and distance between nearest atoms of 3.81 Å (0.381 nm) of the oxide super conducting materials having the composition of $Y_1Ba_2Cu_3O_{7-x}$. Difference in the distance between nearest atoms from that of the oxide superconducting layer having the composition of $Y_1Ba_2Cu_3O_{7-x}$ is 1.9% in the case of $Sm_2Zr_2O_7$, but is as large as 4.5% in the case of YSZ which has the distance between nearest atoms of 3.63 Å (0.363 nm). Among the pyrochlore type composite oxides described above, the composite oxides having the compositions of $La_2Zr_2O_7$ and $La_2Hf_2O_7$ and distance between nearest atoms of 3.81 Å

(0.381 nm) which is equal to that of the oxide superconducting materials having the composition of $Y_1Ba_2Cu_3O_{7-x}$, are considered to be particularly promising materials.

Furthermore, other materials of pyrochlore type crystal structure wherein the rare earth element and Zr or Hf are included therein in any value of relative proportion within a range from 0.1: 0.9 to 0.9:0.1, instead of 1:1, may be used. In this case, the crystal structure is not necessarily of the pyrochlore type, and may also have a similar structure called the omission fluorite type or the type C rare earth, which is valid as long as the cubic crystal system is maintained.

Among the composite oxides of the compositions described above, even those having a distance between nearest atoms which is a little different from that of the oxide superconducting materials may be used, as a matter of fact, for the purpose of the present invention because of other favorable characteristics such as the capability to form the film at a high rate.

Now, an apparatus and method of producing the polycrystalline thin film B will be described below.

Figure 4:
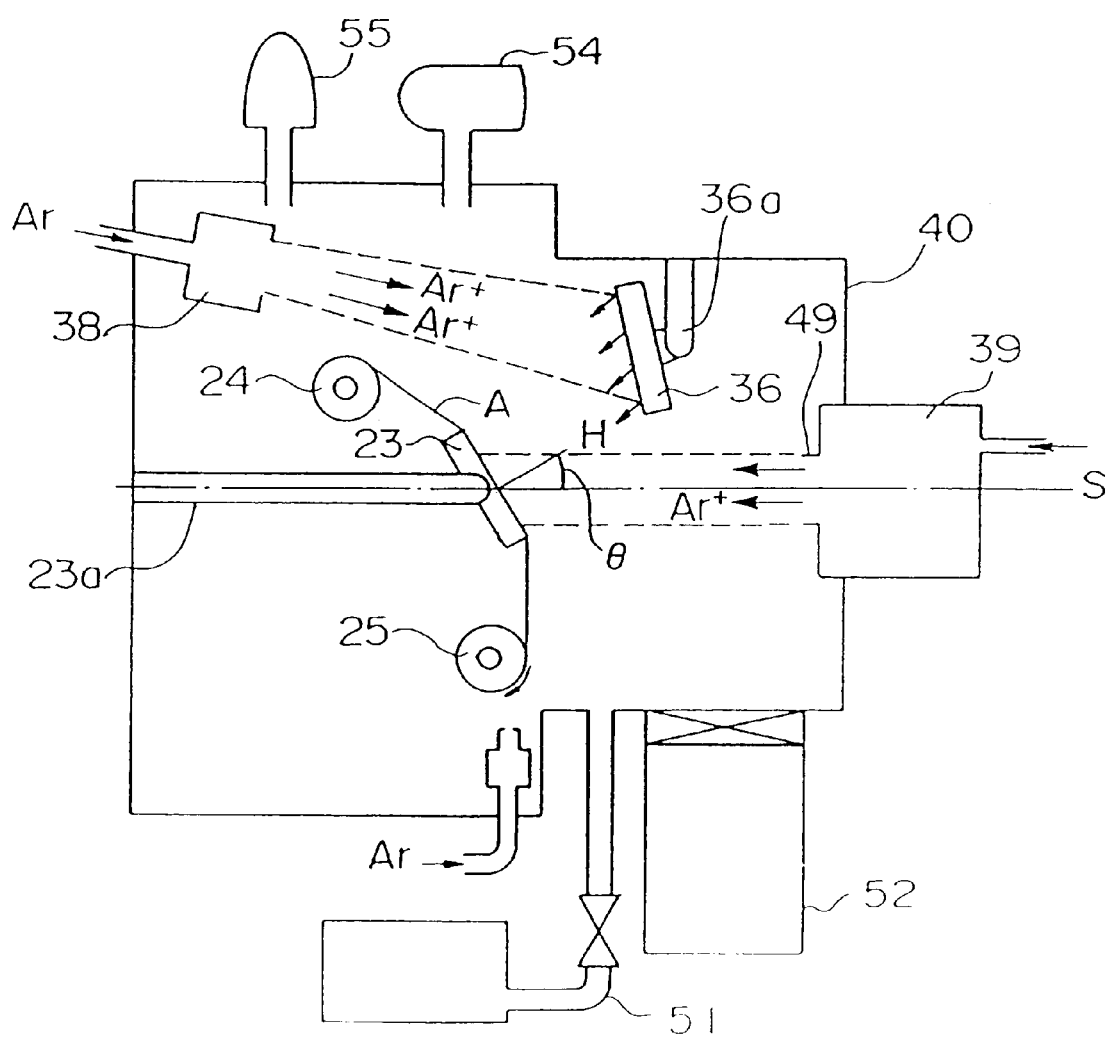
FIG. 4 is a schematic diagram showing an example of an apparatus for producing the polycrystalline thin film according to the present invention.

FIG. 4 shows an example of the apparatus for producing the polycrystalline thin film B, having such a constitution as an ion source for the ion beam assisted operation is provided on a sputtering apparatus.

The apparatus of this example comprises a deposition vessel 40 which can be pumped to produce a vacuum and contains a substrate holder 23 that can heat the polycrystalline substrate A in the form of a tape to a desired temperature while containing it, a substrate feeder reel 24 for feeding the polycrystalline substrate A in the form of tape onto the substrate holder 23, a substrate take-up reel 25 for winding up the polycrystalline substrate A in the form of tape whereon the polycrystalline thin film has been formed, a target 36 in the form of a plate disposed at a distance obliquely above the substrate holder 23 opposing thereto, a sputtering beam generation device 38 disposed obliquely above the target 36 to face the target 36 and an ion source 39 which is disposed at a distance to the side of the substrate holder 23 opposing thereto and at a distance from the target 36.

The substrate holder 23 has a heater installed therein in order to heat the polycrystalline substrate A in the form of a tape which has been fed onto the substrate holder 23 to a desired temperature as required. The substrate holder 23 is mounted on a support base 23a by means of a pin or the like so as to swivel freely, so that the angle of inclination thereof can be adjusted. The substrate holder 23 is disposed in an optimum irradiation area of the ion beam generated by the ion source 39 within the deposition vessel 40.

In this apparatus for producing the polycrystalline thin film, the substrate feeder reel 24 continuously feeds the polycrystalline substrate A in the form of tape onto the substrate holder 23, and the substrate take-up reel 25 winds up the polycrystalline substrate A whereon the polycrystalline thin film has been formed in the optimum irradiation area, thereby to form the polycrystalline thin film continuously on the polycrystalline substrate A. The substrate take-up reel 25 is disposed outside the optimum irradiation area.

The target 36 is provided for the purpose of forming the desired polycrystalline thin film, and is made of a material of the same or similar composition as the polycrystalline thin film. Specifically, the target 36 is made of composite oxides having compositions of $Sm_2Zr_2O_7$, $Gd_2Zr_2O_7$, $La_2Zr_2O_7$, $Ce_2Zr_2O_7$, $Pr_2Zr_2O_7$, $Gd_2Hf_2O_7$, $Sm_2Hf_2O_7$ and $La_2Hf_2O_7$, or the target may be made in such a composition as one of the three constituent elements which is more likely to be scattered after forming the film is included in a higher concentration. The target 36 is mounted on a target holder 36a which is pivoted by means of a pin or the like so as to swivel freely, while the angle of inclination thereof can be adjusted.

In addition to the compositions described above, the target may also be made of a pyrochlore type composite oxide represented by one of formulas $Y_2Zr_2O_7$, $Yb_2Zr_2O_7$, $Tm_2Zr_2O_7$, $Er_2Zr_2O_7$, $Ho_2Zr_2O_7$, $Dy_2Zr_2O_7$, $Eu_2Zr_2O_7$, $Nd_2Zr_2O_7$, $Y_2Zr_2O_7$, $Y_2Hf_2O_7$, $Yb_2Hf_2O_7$, $Tm_2Hf_2O_7$, $Er_2Hf_2O_7$, $Ho_2Hf_2O_7$, $DY_2Hf_2O_7$, $EU_2Hf_2O_7$, $Nd_2Hf_2O_7$, $Pr_2Hf_2O_7$ and $Ce_2Hf_2O_7$. Further other materials of pyrochlore type crystal structure wherein the rare earth element and Zr or Hf are included therein in any value of relative proportion in a range from 0.1:0.9 to 0.9:0.1, instead of 1:1, may be used. In this case, the crystal structure is not necessarily of the pyrochlore type, and it may also have a similar structure called the omission fluorite type or the type C rare earth, which is valid as long as the cubic crystal system is maintained.

The sputtering beam generation device (sputtering means) 38 has such a constitution as the target 36 is irradiated with an ion beam for striking particles out of the target 36 and direct the particles toward the polycrystalline substrate A.

The ion source 39 has a constitution substantially similar to that of the sputtering beam generation device 38, wherein a gas inlet tube is installed in an ionization chamber and a grid for applying a voltage is installed. Some of the atoms or molecules of the introduced gas are ionized, and the ionized particles are controlled by the electric field generated by the grid thereby to form the ion beam. The particles may be ionized by various methods such as the direct current discharge method, radio frequency excitation method, and filament heating method. The filament heating method generates thermal electrons by means of the heat generated by flowing a current in a tungsten filament and causes the electrons to collide with the evaporated particles in a high vacuum, thereby ionizing the particles.

Figure 5A:
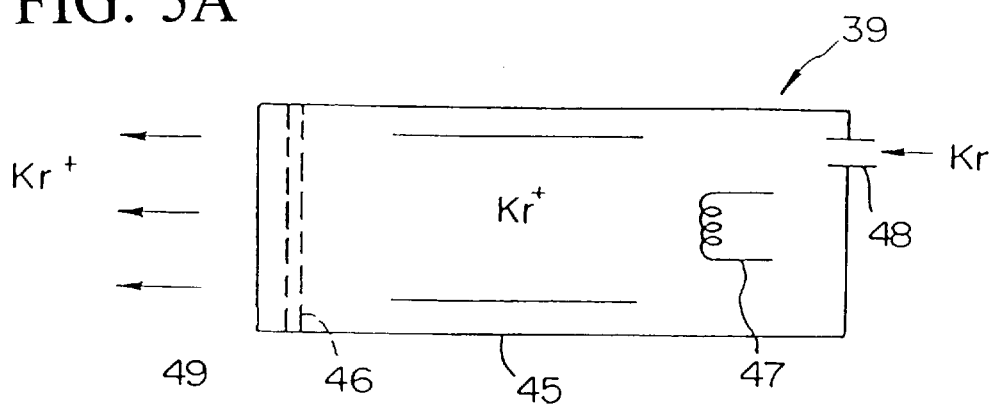
FIG. 5A is a schematic diagram showing an example of an ion source for the apparatus shown in FIG. 4.

In the polycrystalline thin film producing apparatus of such a form as described above, the ion source 39 having the inner constitution shown in FIG. 5A is used. The ion source 39 comprises a cylindrical ionization chamber 45 which contains a grid 46, a filament 47 and an inlet tube 48 for introducing gas such as Ar, Kr, or Xe installed therein, and is capable of emitting ions in a substantially parallel beam from a beam port 49 provided at a distal end of the ionization chamber 45.

The ion source 39 is arranged so that the center line S thereof is inclined at an incident angle θ (angle between the normal direction H of the film forming surface(the top of surface) of the polycrystalline substrate A and the center line S) as shown in FIG. 4 and FIG. 5. The incident angle θ is preferably in a range from 50 to 60°, more preferably in a range from 55 to 60°, and most preferably around 55°. Thus, the ion source 39 is arranged to irradiate the film forming surface of the polycrystalline substrate A with the ion beam at the incident angle θ from the normal direction H. The incident angle of the ion beam is determined in accordance to the patent application which the present inventors previously filed.

For the ion beam applied by the ion source 39 to the polycrystalline substrate A, ions of Ar gas, Kr gas, or Xe gas, or a mixture of two or more selected from among a group of Ar gas, Kr gas, and Xe gas, for example a mixed ion beam of Ar gas, and Kr gas may be used.

The deposition vessel 40 is provided with a rotary pump 51 and a cryopump 52 for pumping the inside of the vessel 40 to produce a vacuum, and an atmosphere gas source such as gas bomb which is connected thereto, so that the evacuated inner space of the deposition vessel 40 can be filled with an inert gas such as argon gas.

The deposition vessel 40 is further equipped with a current density measuring instrument 55 for measuring the current density of the ion beam in the vessel 40 and a pressure gauge 55 for measuring the pressure in the vessel 40.

While the polycrystalline thin film producing apparatus of this example has such an arrangement that the substrate holder 23 is mounted on the support base 23a by means of a pin or the like so as to swivel freely and to adjust the angle of inclination thereof, the incident angle of the ion beam may also be adjusted by installing an angle adjustment mechanism on the support base of the ion source 39, thereby adjusting the inclination angle of the ion source 39. As a matter of course, there is no limitation to the angle adjustment mechanism, and various constitutions may be employed.

Now an operation will be described below for a case such as the case in which the polycrystalline thin film B of pyrochlore type which has the composition of $Sm_2Zr_2O_7$ or the like is formed on the polycrystalline substrate A by using the apparatus of the constitution described above.

In order to form the polycrystalline thin film on the polycrystalline substrate A in the form of a tape, the target 36 made of the composite oxide described above is used, while the inner space of the deposition vessel 40 which houses the polycrystalline substrate A is pumped to a low pressure, the polycrystalline substrate A is fed from the substrate feeder reel 24 onto the substrate holder 23 at a predetermined speed, and the ion source 39 and the sputtering beam generation device 38 are operated.

When the target 36 is irradiated with the ion beam generated by the sputtering beam generation device 38, particles are struck out of the target 36 and impinge on the polycrystalline substrate A. The particles which have been struck out of the target 36 are then caused to be deposited on the polycrystalline substrate A which has been fed onto the substrate holder 23 and are, at the same time, irradiated with ion beam of, for example, $Ar^+$ ions, $Kr^+$ ions, or $Xe^+$ ions, or a mixed ion beam of $Kr^+$ ions and $Xe^+$ ions generated by the ion source 39, thereby forming the polycrystalline thin film of a desired thickness, while the polycrystalline substrate A in the form of a tape with the thin film formed thereon is wound on the substrate take-up reel 25.

The incident angle θ of the ion beam irradiation is preferably in a range from 50 to 60°, and is most preferably 55°. When θ is set to 90°, the c-axis of the polycrystalline thin film of the composite oxide described above cannot be oriented. When θ is set to 30°, even the c-axis orientation of the polycrystalline thin film of the composite oxide described above cannot be achieved. When the ion beam is applied at the incident angle which is set within the preferable range described above, the c-axis of the polycrystalline thin film of the composite oxide described above is oriented in the vertical direction. By sputtering with the ion beam irradiation at such an incident angle, a-axes of different grains of the polycrystalline thin film of the composite oxide formed on the polycrystalline substrate A are aligned in the same direction and are oriented in a plane which is parallel to the top surface (film forming surface) of the polycrystalline substrate A, and this also applies to the b-axes.

When forming the polycrystalline thin film B of the composite oxide described above, it is preferable to control the temperature of the polycrystalline substrate A and the energy of the assisting ion beam within proper ranges, in addition to the incident angle of the assisting ion beam.

Temperature of the polycrystalline substrate A is preferably set to a proper level not higher than 300° C., or preferably in a range from 90 to 300° C. when forming the film, in order to control the grain boundary inclination angles(the grain boundary misalignment angle) within 25° in consideration of results of an embodiment to be described later, more preferably in a range from 150 to 250° C. in order to control the grain boundary inclination angles(the grain boundary misalignment angle) within 20°, and most preferably at 200° C. The temperature of 90° C. is the temperature to which the substrate is naturally heated by the unintended heat generated by the ion beam irradiation on the substrate as well as the operation of the apparatus while the apparatus is operated at normal room temperature, without intended heating of the substrate.

The ion beam energy is preferably in a range from 150 to 300 eV in order to control the grain boundary inclination angles (the grain boundary misalignment angle) within 30°, or preferably in a range from 175 to 225 eV in order to control the grain boundary inclination angles (the grain boundary misalignment angle) within 20°, and most preferably at 200 eV.

When formed on the polycrystalline substrate A by the ion beam assisted process with the temperature and ion beam energy controlled in these ranges, the polycrystalline thin film B of the pyrochlore type or the like can be formed with good orientation.

Figure 2:
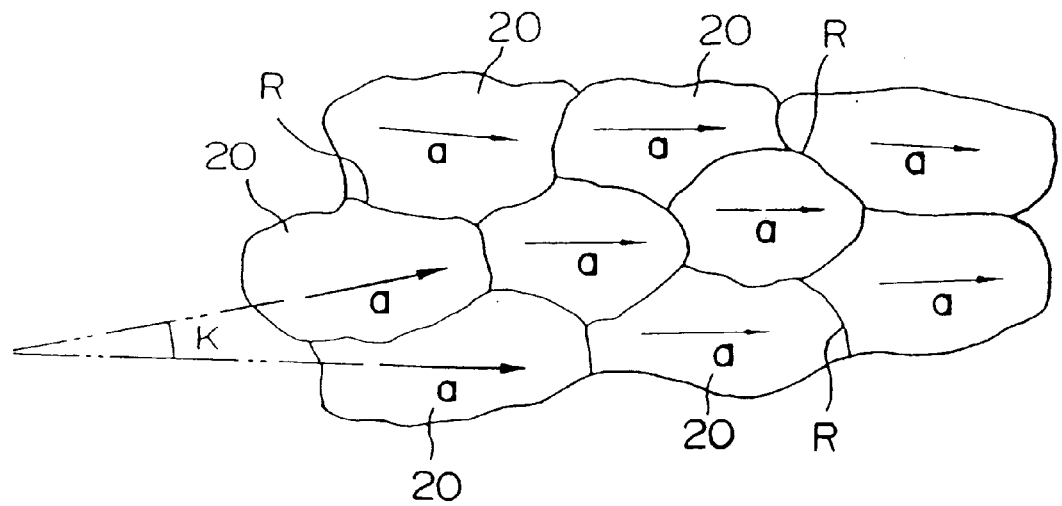
FIG. 2 is an enlarged plan view showing the crystal grains of the polycrystalline thin film shown in FIG. 1, orientation of the crystal axes, and grain boundary inclination angle (grain boundary misalignment angle) thereof.

FIG. 1 and FIG. 2 show the polycrystalline substrate A whereon the polycrystalline thin film B of composite oxide such as $Sm_2Zr_2O_7$ is formed by the method described above. While FIG. 1 shows a case where only one layer of the crystal grains 20 is formed, the crystal grains 20 may in fact also be deposited in a plurality of layers.

The present inventors believe that the cause of crystal orientation of the thin polycrystalline film B to be aligned is as follows.

Figure 5B:
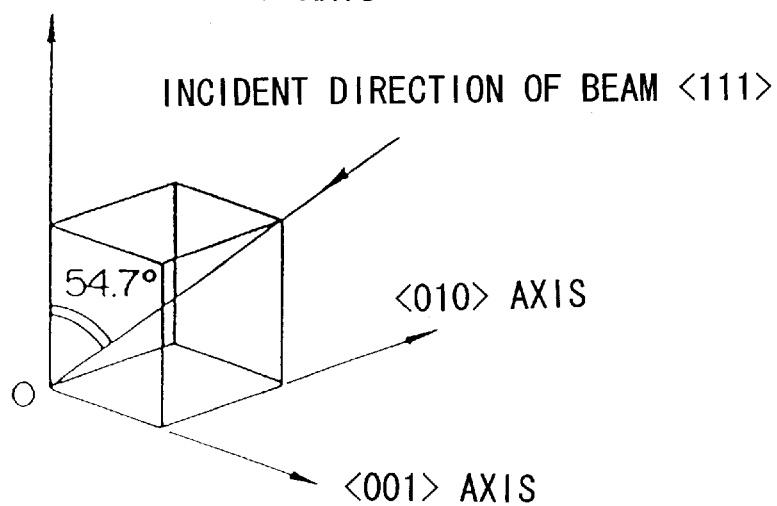
FIG. 5B is a diagram showing the incident angle of an ion beam.

The unit lattice of the crystal of the thin polycrystalline film B of $Sm_2Zr_2O_7$ has the pyrochlore structure of face-centered cubic system of isometric crystal structure as shown in FIG. 5B, wherein the normal direction of the substrate lies on <100> axis with the remaining <010> axis and <001> axis being aligned as shown in FIG. 5B. Consideration of the ion beam incident at an angle from the normal direction of the substrate with respect to these directions shows that the incident angle is 54.7° when the beam is directed in the diagonal direction of the unit lattice passing the origin O in FIG. 5B, namely along the <111> direction. The reason for good crystal orientation being obtained when the incident angle is in a range from 50° to 60° as described above is believed to be as follows. When the ion beam is incident at an angle of around 54.7°, ion channeling occurs most effectively so that only such atoms that are stabilized in an arrangement corresponding to that angle on the top surface of the polycrystalline substrate A are more likely to be selectively left to remain therein, while the other unstable atoms in disturbed atom arrangement are sputtered by the ion beam and removed. As a result, only such crystals constituted of well-oriented atoms can remain selectively to be deposited.

Even when the polycrystalline thin film B of $Sm_2Zr_2O_7$ is formed under the conditions described above, satisfactory ion beam channeling effects cannot be achieved unless the temperature of the polycrystalline substrate A during film forming process and the ion beam energy during the ion beam assisted process are set in the ranges described above. Therefore, it is necessary to control all of the three parameters of the incident angle of the assisting ion beam, the temperature of the polycrystalline substrate A, and the ion beam energy within the proper ranges when forming the film.

Now, reference will be made to FIG. 6 and FIG. 7 which show an embodiment of the oxide superconductor element according to the present invention. The oxide superconductor element 22 of this embodiment comprises the polycrystalline substrate A having the form of a tape, the polycrystalline thin film B formed on the top surface of the polycrystalline substrate A and the oxide superconducting layer C formed on the top surface of the polycrystalline thin film B.

The polycrystalline substrate A and the polycrystalline thin film B are made of materials equivalent to those described in the preceding example, and the crystal grains 20 of the polycrystalline thin film B are oriented so that the gain boundary inclination angles(the grain boundary misalignment angle) thereof are not larger than 25°, and preferably in a range from 17° to 20° as shown in FIG. 1 and FIG. 2.

The oxide superconducting layer C is formed to cover the top surface of the polycrystalline thin film B of $Sm_2Zr_2O_7$ with the c-axes of the crystal grains 21 being oriented perpendicular to the top surface of the polycrystalline thin film B, while the a-axis and b-axis of the crystal grains 21 are oriented in a plane parallel to the top surface of the substrate similarly to the case of the polycrystalline thin film B described previously, and the grain boundary inclination angles (the grain boundary misalignment angle) K' between the crystal grains 21 are controlled within 30 degrees.

The oxide superconducting material which makes the oxide superconducting layer is an oxide superconducting material having a high critical temperature having a composition represented by $Y_1Ba_2Cu_3O_{7-x}$, $Y_2Ba_4Cu_8O_x$ or $Y_3Ba_3Cu_6O_x$, or a composition of $(Bi,Pb)_2Ca_2Sr_2Cu_3O_x$ or $(Bi, Pb)_2Ca_2Sr_3Cu_4O_x$, or a composition of $Tl_2Ba_2Ca_2Cu_3O_x$, $Tl_1Ba_2Ca_2Cu_3O_x$ or $Tl_1Ba_2Ca_3Cu_4O_x$, but a superconductor of other oxide may in fact also be used.

The oxide superconducting layer C is formed, for example, on the polycrystalline thin film B described previously by such a film forming process as sputtering or laser deposition wherein the oxide superconducting layer formed on the polycrystalline thin film B also has a crystal orientation that is matched to the orientation of the polycrystalline thin film B of the pyrochlore type composite oxide such as $Sm_2Zr_2O_7$. As a result, since the oxide superconducting layer formed on the polycrystalline thin film B is superior in quantum coupling in the grain boundaries and hardly experiences degradation of the superconducting property in the grain boundaries, so that the oxide superconducting layer has high conductivity for electric current in the lengthwise direction the polycrystalline substrate A and provides a sufficiently high critical current density comparable to that of oxide superconducting layer obtained by forming on a single crystal substrate such as MgO or $SrTO_3$.

For the material to make the polycrystalline thin film B, a pyrochlore type composite oxide such as $Sm_2Zr_2O_7$ is preferable over YSZ, and the oxide superconductor element made by forming the oxide superconducting layer on the polycrystalline thin film of the pyrochlore type composite oxide such as $Sm_2Zr_2O_7$ has better crystal orientation and is more durable under high temperatures (700 o 800° C.) in heat treatment than that provided with the oxide superconducting layer formed on the polycrystalline thin film of YSZ, and shows a satisfactory critical current density similar to or higher than the case where the oxide superconducting layer is formed on the polycrystalline thin film of YSZ, thus due also to the stabilized orientation, giving an advantage in maintaining good characteristics when forming a long layer. When the film thickness increases, in particular, the critical current density experiences smaller amount of decrease even after being heated in heat treatment or the like, and it is made possible to make a superconductor element having a high critical current.

The reason for the above is believed to be as follows.

First, the polycrystalline thin film made of the pyrochlore type composite oxide such as $Sm_2Zr_2O_7$, which has the distance between nearest atoms nearer to that of the oxide superconducting layer than the polycrystalline thin film of YSZ does, is more advantageous in view of crystal matching and makes it easier to form the oxide superconducting layer having better crystal orientation.

Second, as will be shown by an embodiment to be described later, since the ion beam energy and the temperature during film formation can be set in wide ranges, stable crystal orientation can be achieved even when these conditions experience some variations while continuously forming a long layer over a long period of time.

Now the apparatus for forming the oxide superconducting layer C will be described below.

Figure 8:
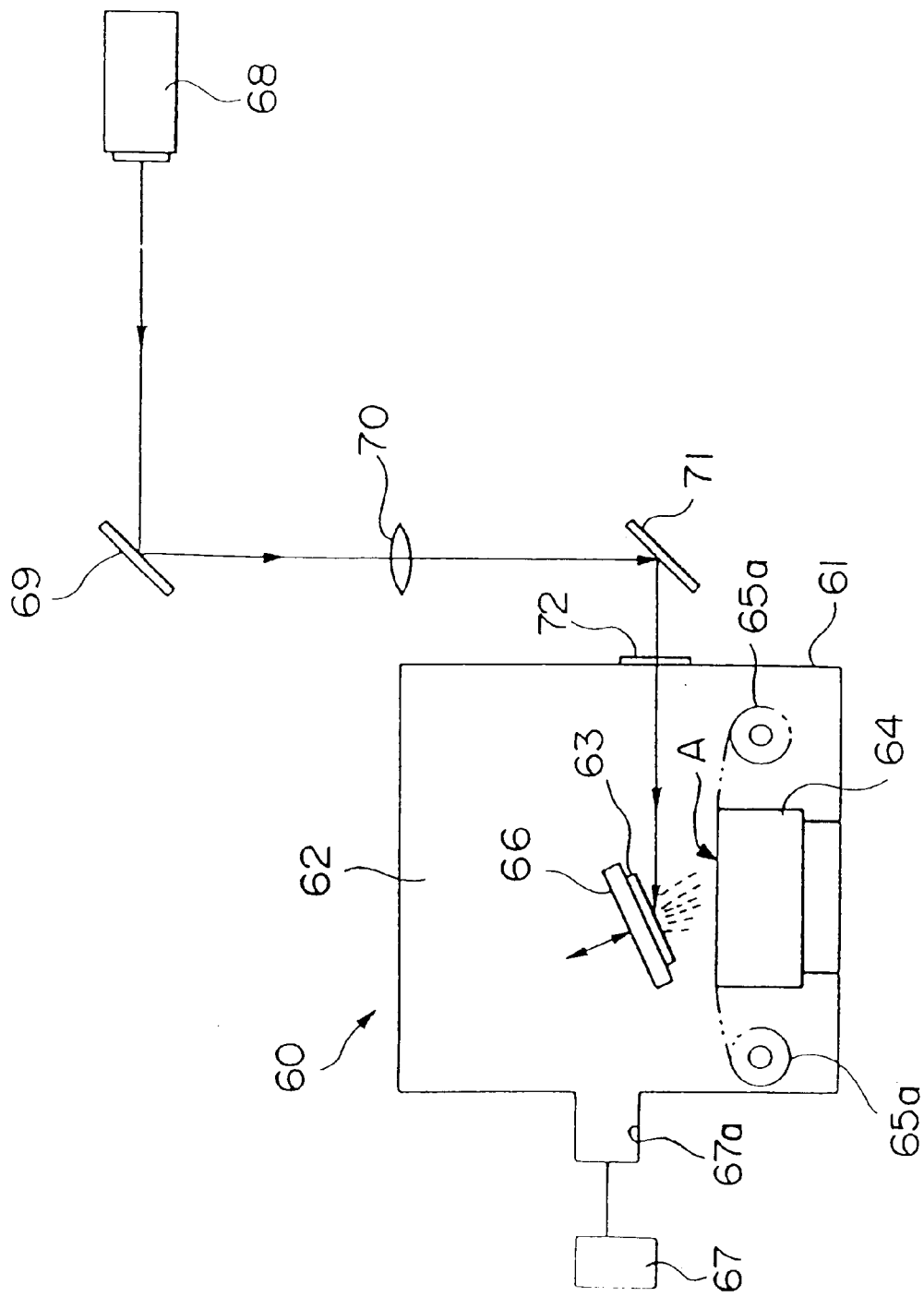
FIG. 8 is a schematic diagram showing an example of apparatus for forming an oxide superconducting layer on the polycrystalline thin film shown in FIG. 1.

FIG. 8 shows an example of the apparatus for forming the oxide superconducting layer, and FIG. 8 shows a laser deposition apparatus.

The laser deposition apparatus 60 of this example has a processing vessel 61, where the polycrystalline substrate A in the form of a tape and the target 63 can be installed in a deposition chamber 62 provided in the processing vessel 61. Specifically, a base 64 is placed at the bottom of the deposition chamber 62 so that the polycrystalline substrate A can be placed horizontally on the top surface of the base 64, and the target 63 supported by a holder 66 is disposed in an inclined state obliquely above the base 64. The polycrystalline substrate A is fed from a drum-shaped tape feeder 65a onto the base 64 and is wound up by a drum-shaped tape take-up device 65a. The processing vessel 61 is connected to a vacuum pumping system 67 via an exhaust port 67a, so that the inner pressure of the vessel can be decreased to a predetermined level.

The target 63 is a sheet made of a sintered composite oxide or an oxide superconducting material having the same or similar composition as the oxide superconducting layer C to be formed, or including a high concentration of a component which is likely to be released into the atmosphere during the film forming process.

The base 64 incorporates a heater so as to heat the polycrystalline substrate A to a desired temperature.

Located laterally to the processing chamber 61 are a laser device 68, a first reflector 69, a condenser lens 70 and a second reflector 71, so that a laser beam emitted by the laser device 68 can be directed to the target 63 so as to be incident thereon via a transparent window 72 provided in a sidewall of the processing vessel 61. The laser device 68 may be of any type including a YAG laser and excimer laser as long as it can eject particles out of the target 63.

Now, an operation to form the oxide superconducting layer C on the polycrystalline thin film B made of the pyrochlore type composite oxide such as $Sm_2Zr_2O_7$ will be described below.

The oxide superconducting layer is formed on the polycrystalline thin film B after forming the polycrystalline thin film B having the composition of $Sm_2Zr_2O_7$ on the polycrystalline substrate A, as described above. In this embodiment, the laser deposition apparatus 60 shown in FIG. 8 is used to form the oxide superconducting layer on the polycrystalline thin film B.

The polycrystalline substrate A having the polycrystalline thin film B formed thereon is placed on the base 64 of the laser deposition apparatus 60 shown in FIG. 8, and the deposition chamber 62 is evacuated by a vacuum pump. At this time, oxygen gas may be introduced into the deposition chamber 62 to create an oxygen atmosphere in the deposition chamber 62. The heater incorporated in the base 64 is energized to heat the polycrystalline substrate A to a desired temperature.

Then the target 63 placed in the deposition chamber 62 is irradiated with the laser beam emitted by the laser device 68. This causes the material that makes up the target 63 to be ejected out of the target or be vaporized and be deposited on the polycrystalline thin film B. Since the polycrystalline thin film B made of $Sm_2Zr_2O_7$ has been turned into such a state, when depositing the particles, as the c-axis orientation is achieved while a-axis and b-axis are also oriented, epitaxial growth of the crystal is achieved so that c-axes, a-axes, and b-axes of the crystal of the oxide superconducting layer C formed on the polycrystalline thin film B are matched to the polycrystalline thin film B.

Moreover, since the distance between nearest atoms of the polycrystalline thin film B made of $Sm_2Zr_2O_7$ is 3.74 Å which is very near to that of the oxide superconducting material which has the composition of $Y_1Ba_2Cu_3O_{7-x}$, which is 3.81 Å, satisfactory epitaxial growth of the crystal is achieved so that the oxide superconducting layer C having satisfactory crystal orientation can be obtained.

Figure 6:
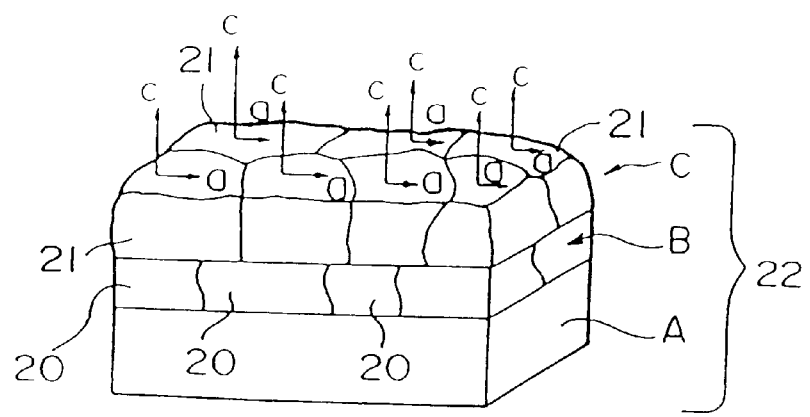
FIG. 6 is a schematic diagram showing an oxide superconducting layer formed on the polycrystalline thin film shown in FIG. 1.
Figure 7:
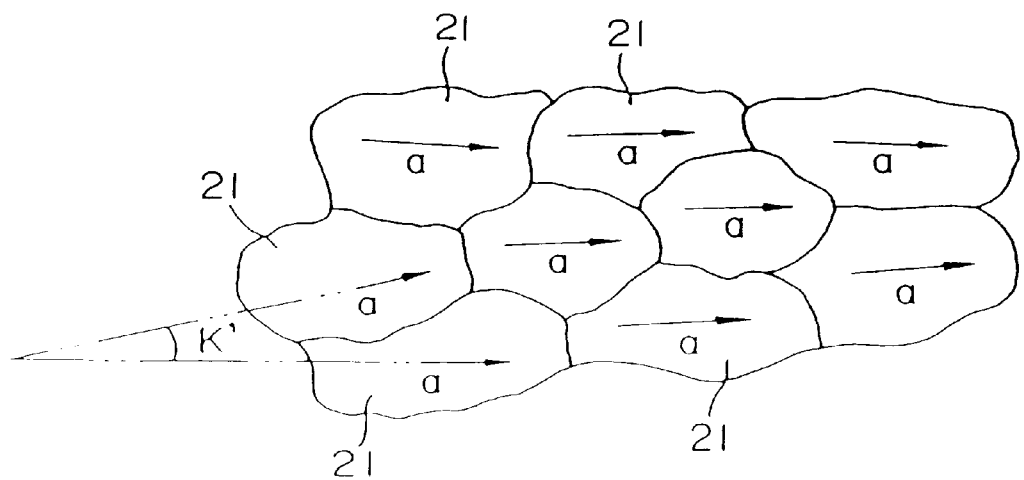
FIG. 7 is an enlarged plan view showing the crystal grains of the oxide superconducting layer shown in FIG. 6, orientation of the crystal axes and grain boundary inclination angle(grain boundary misalignment angle) thereof.

The oxide superconducting layer C formed on the polycrystalline thin film B has a polycrystalline state, although in the individual crystal grains of the oxide superconducting layer C, the c-axis in which electrical conductivity of the material is low is oriented in the direction of thickness of the polycrystalline substrate A, and a-axes or b-axes of different grains are oriented in the longitudinal direction of the polycrystalline substrate A, as shown in FIG. 6. Since the oxide superconducting layer thus formed has good quantum coupling characteristics in the grain boundaries and experiences less degradation in the superconducting property in the grain boundaries, electric conductivity is high in the direction of the plane of the polycrystalline substrate A and the critical current density is high. In order to stabilize the crystal orientation and film quality of the superconducting layer C, it is preferable to apply heat treatment for heating to a temperature of 700 to 800° C. for an appropriate period of time and then cooling.

Embodiment

With the polycrystalline thin film production apparatus which has the constitution shown in FIG. 4, the deposition vessel of the production apparatus was evacuated by means of a rotary pump and a cryopump to decrease the pressure to $399.9 \times 10^{-4}$ Pa ($3.0 \times 10^{-4}$ Torr). A tape of Hastelloy C276 measuring 10 mm in width, 0.5 mm in thickness and 100 cm in length which was polished to a mirror quality finish was used as the substrate in the form of a tape. The target was made of the composite oxide having the composition of $Sm_2Zr_2O_7$. Sputtering conditions were set as follows: the sputtering voltage of 1000 V, sputtering current of 100 mA, incident angle of the $Ar^+$ ion beam generated by the ion source being 55° from the normal direction of the film forming surface of the substrate, travel distance of the ion beam being 40 cm, ion source assist voltage of 200 eV, substrate tape temperature being 20°, and oxygen being supplied into the processing atmosphere at $133.3 \times 10^{-4}$ Pa ($1 \times 10^{-4}$ Torr), thereby depositing the particles of the target on the substrate and, at the same time, forming the polycrystalline thin film of $Sm_2Zr_2O_7$ to a thickness of 1.0 μm by irradiating with the ion beam.

Figure 9:
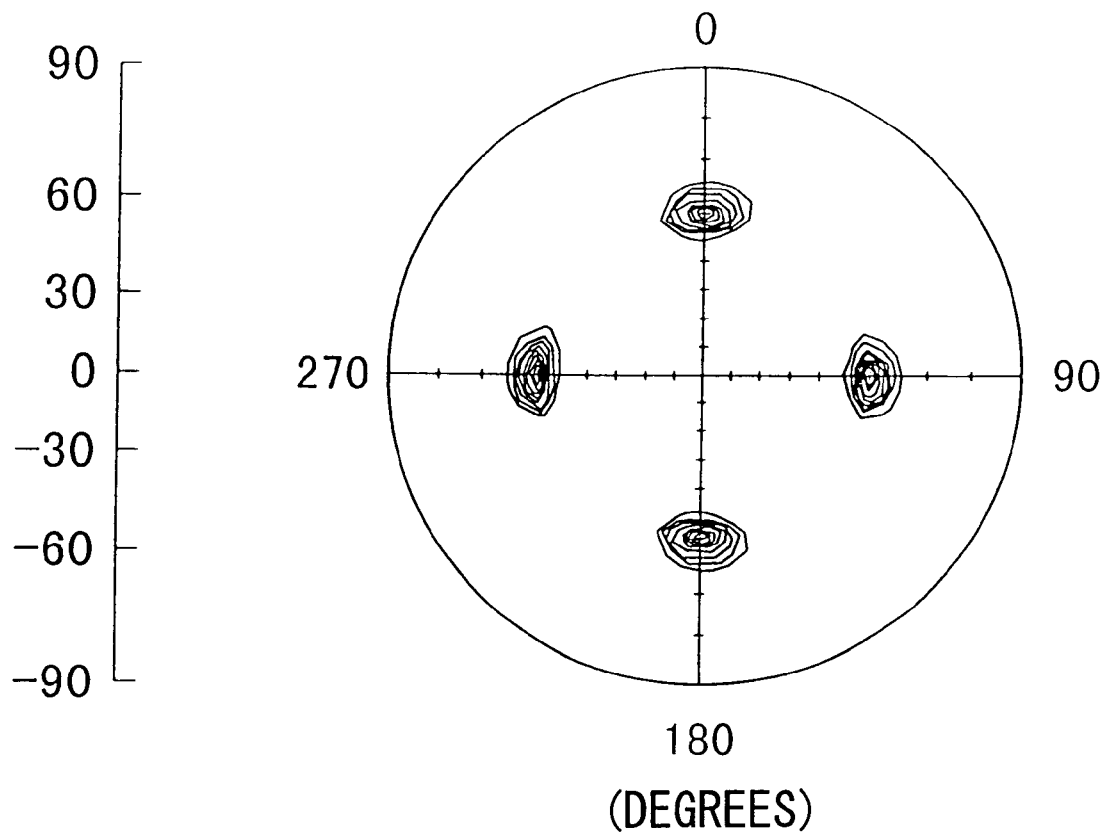
FIG. 9 is a polar figure of a polycrystalline thin film of $Sm_2Zr_2O_7$ fabricated in an embodiment.

Based on X-ray diffraction analysis of the polycrystalline thin film of $Sm_2Zr_2O_7$ thus obtained by θ-2θ method using CuKα line, a polar figure of $Sm_2Zr_2O_7$ as shown in FIG. 9 was drawn. From the polar figure shown in FIG. 9, it can be seen that the polycrystalline thin film made of the composite oxide having the composition of $Sm_2Zr_2O_7$ has satisfactory crystal orientation. The value of the full width at half maximum (FWHM) which corresponds to the grain boundary inclination angle(the grain boundary misalignment angle) of the polycrystalline thin film of $Sm_2Zr_2O_7$ was determined from the polar figure shown in FIG. 9 to be 17.1°.

Figure 10:
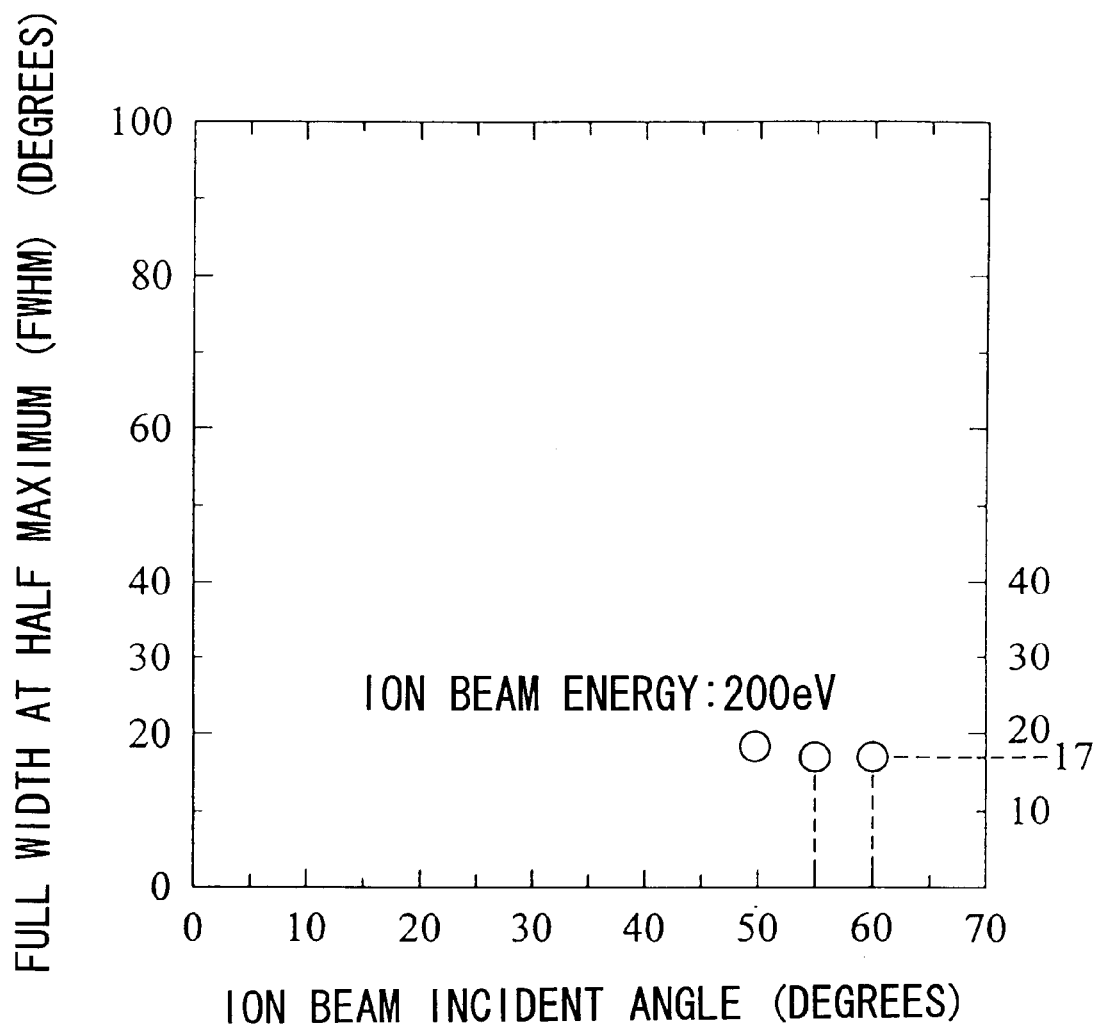
FIG. 10 shows the relationship between the incident angle of ion beam and crystal orientation during the production of the polycrystalline thin film having composition of $Sm_2Zr_2O_7$ obtained in the embodiment.

A polycrystalline thin film of $Sm_2Zr_2O_7$ was made under similar conditions except for the incident angle of the ion beam being set to 60°, resulting in $Sm_2Zr_2O_7$ of good crystal orientation having the grain boundary inclination angle (equivalent to the full width at half maximum) shown in FIG. 10. A sample obtained with the incident angle of the ion beam set to 50° showed a slightly poorer quality, but a grain boundary inclination angle(the grain boundary misalignment angle) of 19° was obtained.

No experiment was conducted with the incident angle of the ion beam less than 50° or greater than 60°. However, based on the experience in the technologies related to the patent applications by the present inventors described previously, it can well be assumed that an intermediate layer having good crystal orientation would not be obtained when the incident angle of the ion beam is set less than 50° or greater than 60° in the ion beam assisted process.

Then, the film forming conditions for the polycrystalline thin film of $Sm_2Zr_2O_7$ were checked by testing the orientation of the polycrystalline thin film of $Sm_2Zr_2O_7$ obtained by changing the energy of the $Ar^+$ ion beam and the substrate temperature, with the results as described below.

Figure 11:
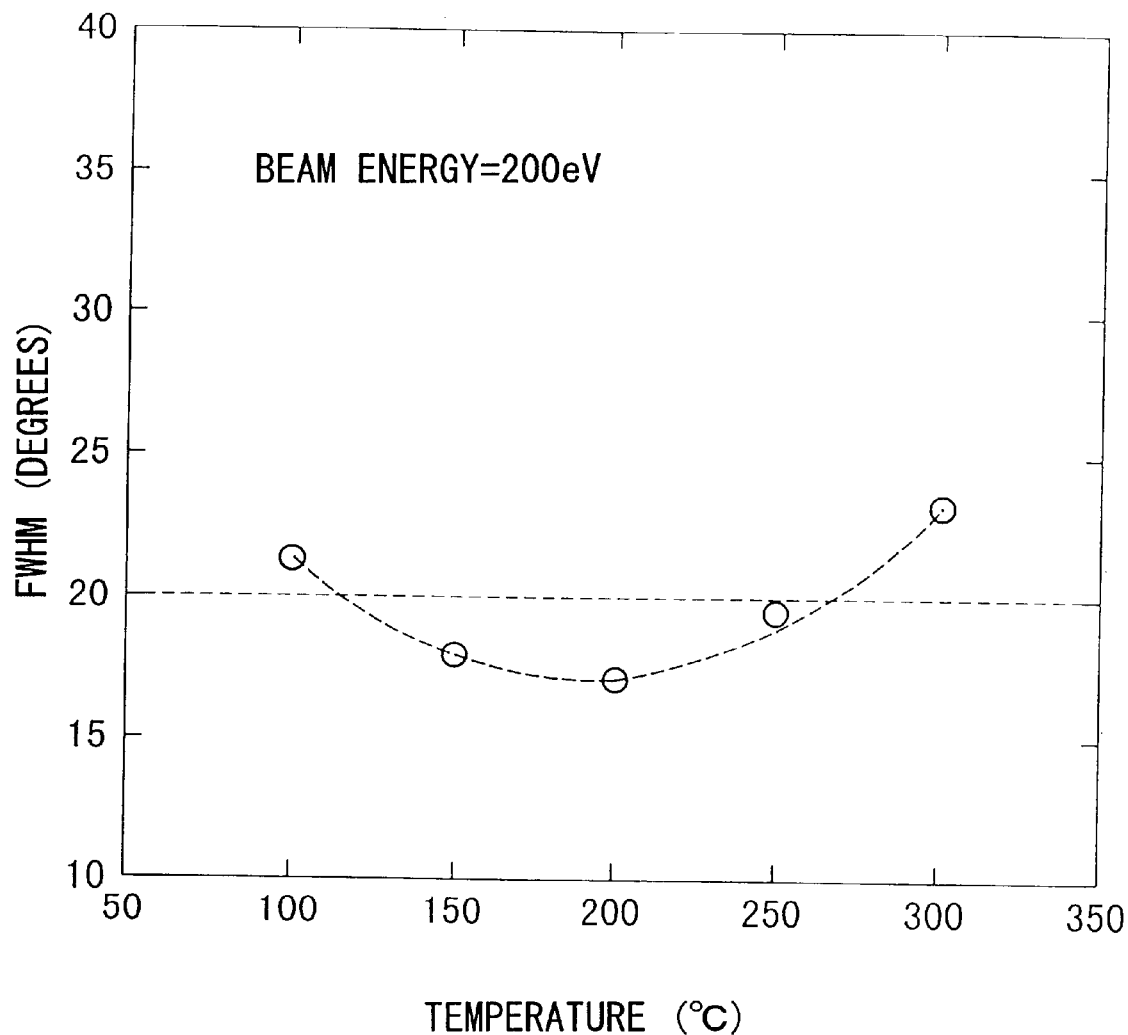
FIG. 11 shows the relationship between the substrate temperature and the full width at half maximum in the polycrystalline thin film having composition of $Sm_2Zr_2O_7$ fabricated in the embodiment.

A polycrystalline thin film of $Sm_2Zr_2O_7$ made under production conditions almost the same as those described above showed substrate temperature dependency of full width at half maximum (FWHM), which was obtained from the polar figure shown in FIG. 9, as shown in FIG. 11.

A sample formed at the substrate temperature, namely film forming temperature, of 200° showed the best result with full width at half maximum of 17.1°. The result shown in FIG. 11 indicates that temperature must be set in a range from 100° C. to 300° C. in order to surely control the value of full width at half maximum namely the grain boundary misalignment angle with in 25°, and in a range from 150° C. to 250° C. in order to surely control the grain boundary misalignment angle within 20°.

Figure 12:
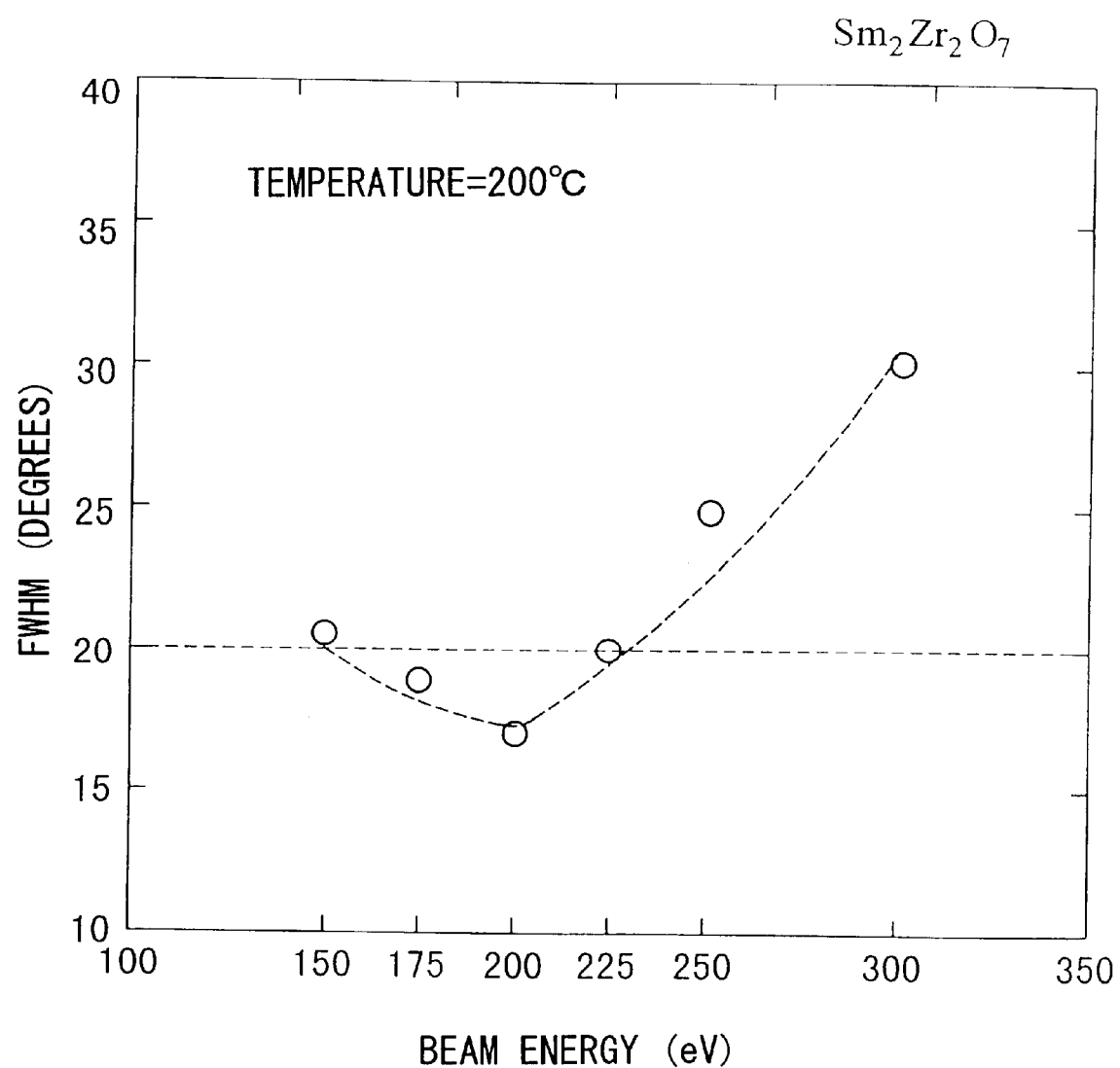
FIG. 12 shows the relationship between the ion beam energy and the full width at half maximum in the polycrystalline thin film having a composition of $Sm_2Zr_2O_7$ fabricated in the embodiment.

Measurements of the full width at half maximum of the polycrystalline thin film of $Sm_2Zr_2O_7$ with different ion beam energies are shown in FIG. 12. Other conditions are similar to those of the experiment described first.

It was found from the results shown in FIG. 12, that the ion beam energy must be set in a range from 150 eV to 300 eV in order to control the grain boundary inclination angle (the grain boundary misalignment angle) of the polycrystalline thin film of $Sm_2Zr_2O_7$ within 30°, and the ion beam energy must be set in a range from 175 eV to 225 eV in order to control the grain boundary inclination angle(the grain boundary misalignment angle) reliably within 20°.

Figure 13:
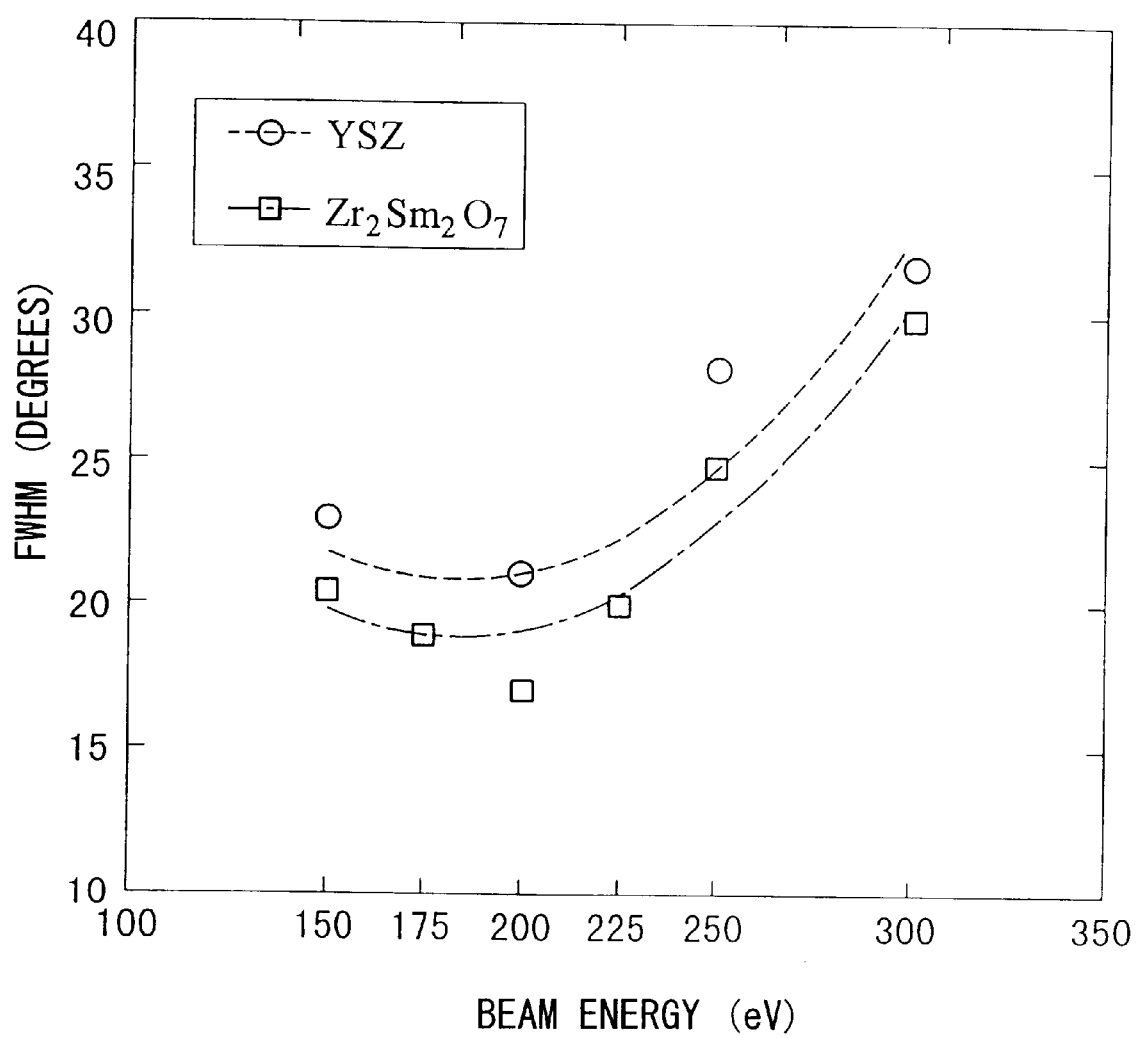
FIG. 13 shows the relationship between the full width at half maximum of the polycrystalline thin film having a composition of $Sm_2Zr_2O_7$ obtained in the embodiment and the full width at half maximum of the polycrystalline thin film of YSZ fabricated as a reference example.

FIG. 13 compares the ion beam energy dependency in the case of a polycrystalline thin film of $Sm_2Zr_2O_7$ formed on a substrate and the ion beam energy dependency in the case of a polycrystalline thin film of YSZ (polycrystalline thin film of stabilized zirconia formed under conditions similar to those described above except for adding 3 at % of $Y_2O_3$) formed on a substrate.

The comparison shown in FIG. 13 indicates that the polycrystalline thin film of $Sm_2Zr_2O_7$ formed by the method of the present invention achieves lower values of grain boundary inclination angle (the grain boundary misalignment angle) than the polycrystalline thin film of YSZ at any level of the ion beam energy. Thus, it is found that the polycrystalline thin film of $Sm_2Zr_2O_7$ is easier to produce even in the case in which the ion beam energy fluctuates during production. This means that the polycrystalline thin film of $Sm_2Zr_2O_7$ is less dependent on the producing conditions and has higher stability than the polycrystalline thin film of YSZ.

Then the oxide superconducting layer was formed on the polycrystalline thin film of $Sm_2Zr_2O_7$ by using the laser deposition apparatus having the constitution shown in FIG. 8. A target made of an oxide superconducting material having the composition of $Y_1Ba_2Cu_3O_{7-x}$ was used. The deposition chamber was evacuated to decrease the inner pressure thereof to 26.6 Pa ($2 \times 10^{-1}$ Torr), and laser deposition was carried out at a substrate temperature of 700° C. A KrF excimer laser oscillating at wavelength 248 nm was used for vaporizing the target. Then, a heat treatment was applied in an oxygen atmosphere at 400° C. for 60 minutes. An oxide superconductor element measuring 1.0 cm in width and 100 cm in length was obtained.

The oxide superconductor element made as described above was dipped in liquid nitrogen and the critical current density in a middle portion thereof measuring 10 mm×10 mm was measured by the four terminal method, with a very good result of Jc=$1.3 \times 10^6$ (A/cm$^2$).

Thus, it has been made possible to improve the crystal orientation in the oxide superconducting layer formed on the polycrystalline thin film of $Sm_2Zr_2O_7$ having good crystal orientation, thereby proving that a critical current density comparable to that of an oxide superconducting layer of similar composition formed on a single crystal substrate can be achieved.

Figure 14:
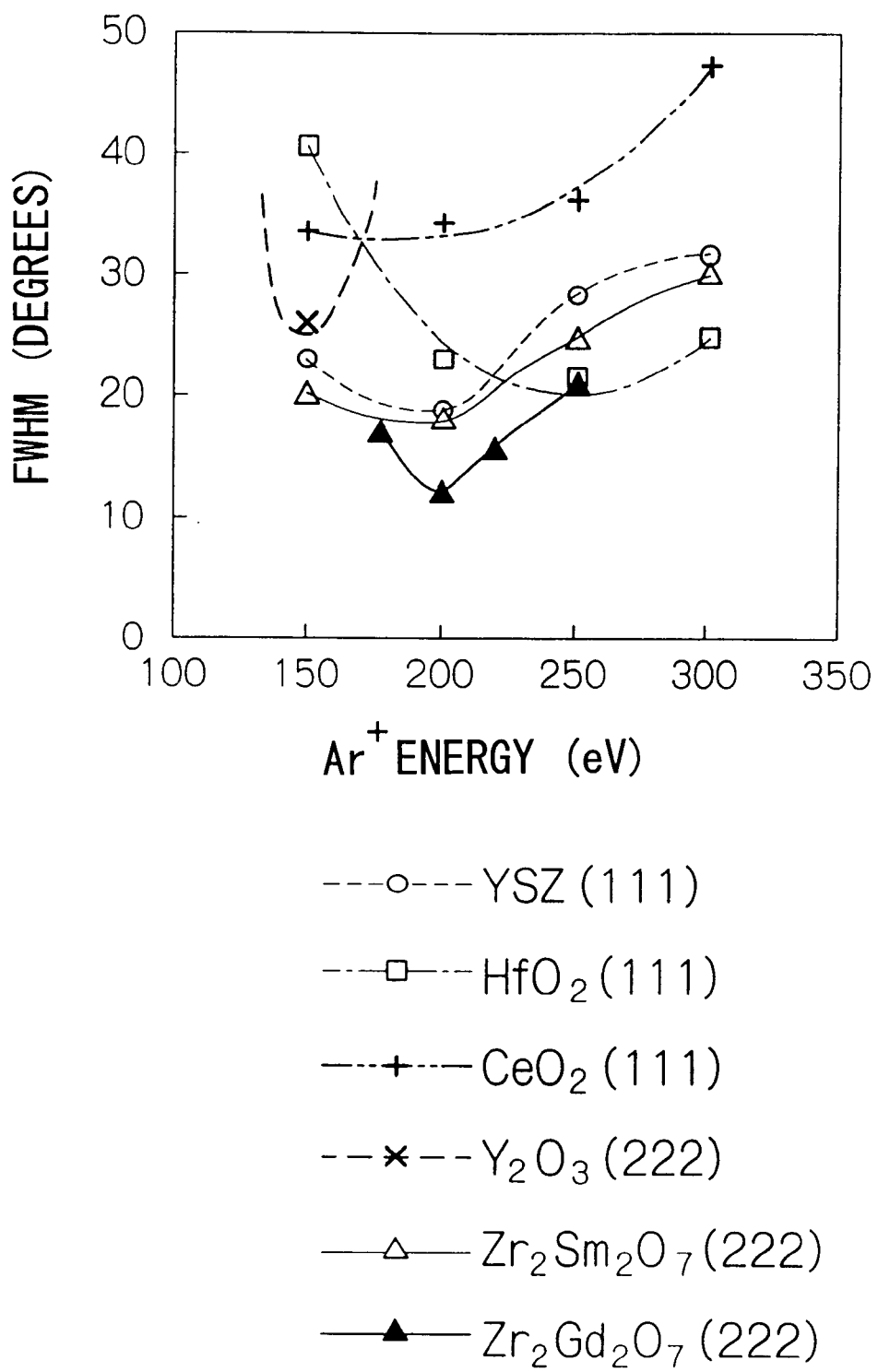
FIG. 14 is a diagram showing the dependence of FWHM value on the $Ar^+$ ion beam energy in the cases of a YSZ polycrystalline thin film, $HfO_2$ polycrystalline thin film, $CeO_2$ polycrystalline thin film, $Y_2O_3$ polycrystalline thin film, $Sm_2Zr_2O_7$ polycrystalline thin film and $Gd_2Zr_2O_7$ polycrystalline thin film.

Then, a polycrystalline thin film of YSZ, a polycrystalline thin film of $HfO_2$, a polycrystalline thin film of $CeO_2$, a polycrystalline thin film of $Y_2O_3$ (rare earth oxide type crystal structure), a polycrystalline thin film of $Sm_2Zr_2O_7$ and a polycrystalline thin film of $Gd_2Zr_2O_7$ were formed on substrate tapes using $Ar^+$ ion beam similarly to the example described previously. FIG. 14 shows the measurements of full width at half maximum (FWHM) which corresponds to the grain boundary inclination angle (the grain boundary misalignment angle) of the polycrystalline thin films of the different composite oxides thus obtained.

As will be clearly seen from the results of measurements shown in FIG. 14, all of the polycrystalline thin films of the different composite oxides showed good crystal orientation, although the grain boundary inclination angle (the grain boundary misalignment angle) differed somewhat among the polycrystalline thin films of different compositions.

With either the polycrystalline thin film of $Sm_2Zr_2O_7$ or the polycrystalline thin film of $Gd_2Zr_2O_7$ of the present invention, it is preferable to carry out ion beam assisting operation by setting the ion beam energy in a range from 150 to 300 eV, especially in a range from 150 to 250 eV, and most preferably at 200 eV.

Figure 15:
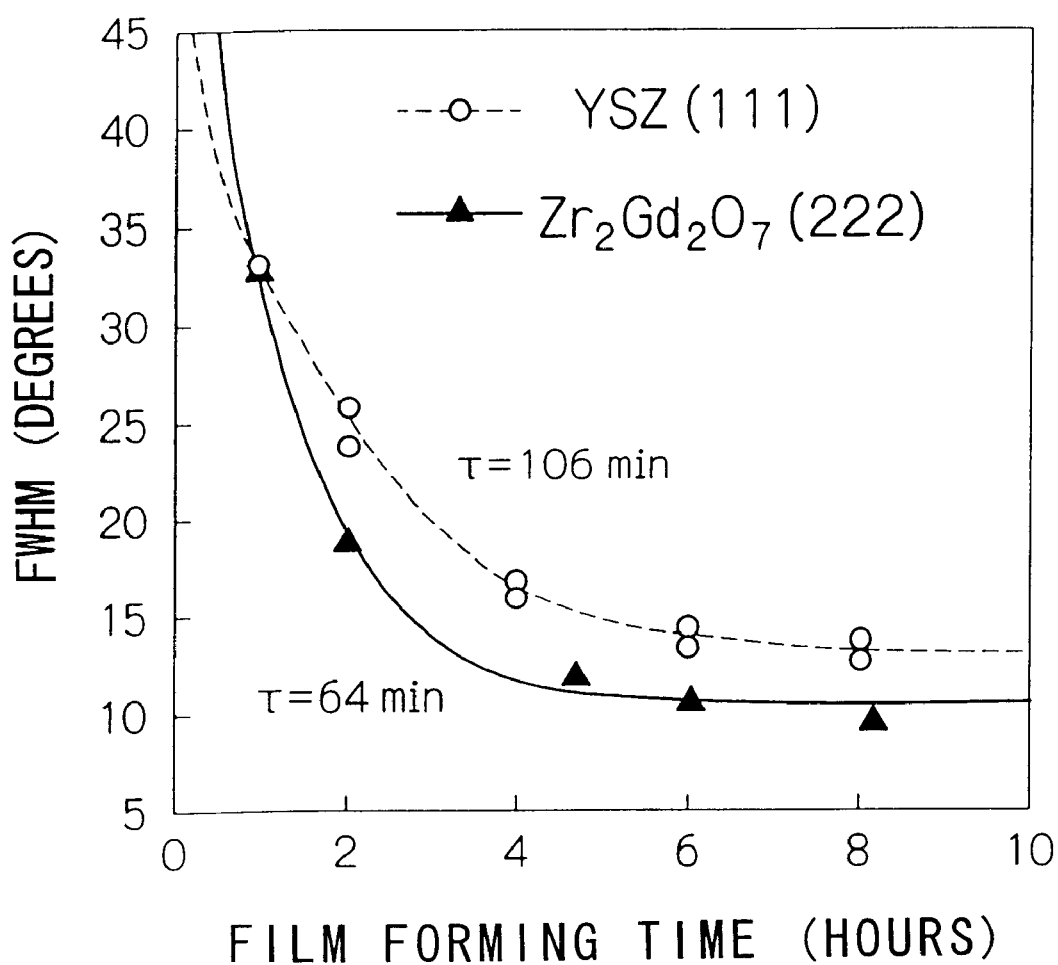
FIG. 15 is a graph comparing the film forming rate between $Gd_2Zr_2O_7$ polycrystalline thin film and YSZ polycrystalline thin film.
Figure 16:
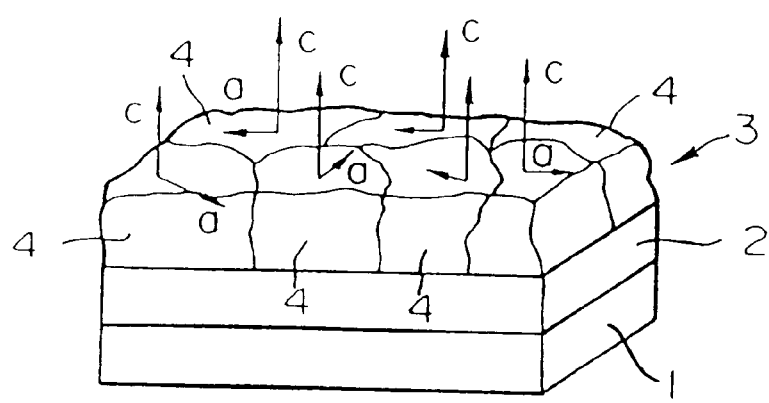
FIG. 16 is a schematic diagram showing a polycrystalline thin film produced with a prior art apparatus.
Figure 17:
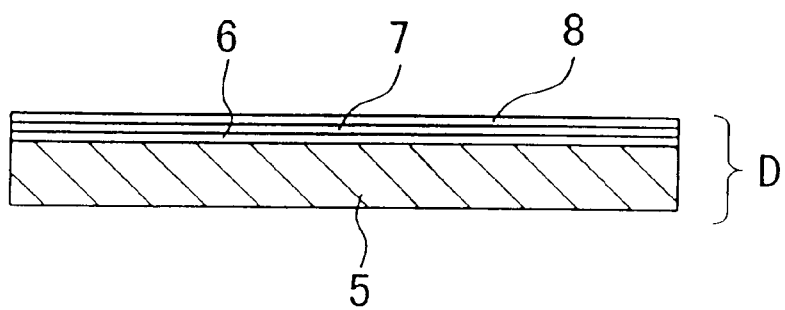
FIG. 17 is a sectional view showing an example of an oxide superconductor element of the prior art.

FIG. 15 shows the relation between the value of FWHM which corresponds to the grain boundary inclination angle (the grain boundary misalignment angle) and the duration of the film forming process when the polycrystalline thin film of YSZ and the polycrystalline thin film of $Gd_2Zr_2O_7$ were formed at a substrate temperature of 200° C. with ion beam energy of 200 eV, with the other conditions set similarly to those of the previous example.

FIG. 15 shows that the polycrystalline thin film of $Gd_2Zr_2O_7$ of grain boundary inclination angle (the grain boundary misalignment angle) as low as 10° can be produced with the crystal orientation being further improved over those of the samples described above (the sample shown in FIG. 15 as being formed in the film forming process taking five hours or longer). It is also shown that the polycrystalline thin film of $Gd_2Zr_2O_7$ can be formed in about a half the film forming time as that of the polycrystalline thin film of YSZ which has a comparable level of crystal orientation. In FIG. 15, for example, time constant τ which represents the time taken for the crystal orientation to proceed and is defined by the following formula (1) is 106 minutes in the case of the polycrystalline thin film of YSZ, but is 64 minutes in the case of the polycrystalline thin film of $Gd_2Zr_2O_7$, which is only about 60% that of the former.

$$\phi(t)=\phi\infty+A\times\exp(-t/\tau) \quad (1)$$

where φ is the full width at half maximum, φ∞ is the ultimate value to which the full width at half maximum converges after an infinite length of time, and A is a constant dependent on the initial conditions.

Capability of forming the film in this short period of time is a significant advantage for producing long strips of oxide superconductor element, having the effect of reducing the time taken for production and cutting down on the production cost even when making long oxide superconductor elements.

In FIG. 15, the grain boundary inclination angle (the grain boundary misalignment angle) of the polycrystalline thin film made of YSZ converges, over 6 to 8 hours of the film forming process, within a range from 13 to 15° C., which is better than the data the present inventors have been publishing for the crystal orientation of the YSZ polycrystalline thin films. This is because the ion beam energy and the film forming temperature are optimized and the sputtering time can be made longer by improvements in the apparatus.

Among the other pyrochlore type materials, $Yb_2Zr_2O_7$, $Y_2Zr_2O_7$ and $Ho_2Zr_2O_7$, achieved a rate of orientation which is almost the same as that of YSZ under the film forming conditions similar to those of $Gd_2Zr_2O_7$. With $La_2Zr_2O_7$, meaningful orientation could not be achieved at substrate heating temperatures below 500° C.

What is claimed is:

1. A polycrystalline thin film formed by vapor deposition on a film forming surface of a polycrystalline substrate, the thin film consisting of a composite oxide which has a pyrochlore type crystalline structure of a composition represented as either AZrO or AHfO, wherein A in the formula represents a rare earth element selected from among Y, Yb, Tm, Er, Ho, Dy, Eu, Gd, Sm, Nd, Pr, Ce and La and the grain boundary misalignment angle between the same crystal axes of different crystal grains in the polycrystalline thin film along a plane parallel to the film forming surface of the polycrystalline substrate are controlled within 30°.

2. A polycrystalline thin film as claimed in claim 1, wherein said rare earth element and Zr or Hf which constitute the polycrystalline thin film of the composite oxide that is made mainly of pyrochlore type crystalline structure of the composition represented as either AZrO or AHfO are included therein in a relative proportion which is within a range from 0.1:0.9 to 0.9:0.1, and the crystal is of a cubic system.

3. A polycrystalline thin film as claimed in claim 1, wherein said polycrystalline substrate is a heat resistant metal tape and said crystal grains are made of either $Sm_2Zr_2O_7$ or $Gd_2Zr_2O_7$.

4. A polycrystalline thin film as described in claim 1 wherein the grain boundary misalignment angle between the same crystal axes of different crystal grains in said polycrystalline thin film along a plane parallel to the film forming surface of said polycrystalline substrate are controlled within 20°.

5. A method of producing a polycrystalline thin film consisting of crystal grains made of a composite oxide which has a pyrochlore type crystalline structure of a composition represented as either AZrO or AEFO, A in the representing a rare earth element selected from among Y, Yb, Tm, Er, Ho, Dy, Eu, Gd, Sm, Nd, Pr, Ce and La, formed on the film forming surface of a polycrystalline substrate, with the grain boundary misalignment angle between the same crystal axes of different crystal grains in the polycrystalline thin film along a plane parallel to the film forming surface of the polycrystalline substrate being controlled within 30°, wherein the polycrystalline substrate is heated to a temperature not higher than 300° C. and an ion beam of $Ar^+$, $Kr^+$, or $Xe^+$ or a mixed beam of these ions is generated from an ion source with the energy of the ion beam being set in a range from 150 eV to 300 eV, while the incident angle of the ion beam irradiating the film forming surface of the substrate is set in a range from 50 to 60° from the normal direction of the film forming surface of the substrate, when vapor-depositing the particles generated from a target made of the same elements as those of the polycrystalline thin film on the polycrystalline substrate.

6. A method of producing the polycrystalline thin film as claimed in claim 5, wherein the polycrystalline substrate is heated to a temperature in a range from 90 to 300° C. when depositing the particles generated from the target, which is made of the same elements as those of the polycrystalline thin film, on the polycrystalline substrate.

7. A method of producing the polycrystalline thin film as claimed in claim 5, wherein the energy of the ion beam is set in a range from 175 eV to 225 eV when depositing the particles generated from the target, which is made of the same elements as those of the polycrystalline thin film, on the polycrystalline substrate.

8. A method of producing the polycrystalline thin film as claimed in claim 5, wherein the incident angle of the ion beam irradiating the film forming surface of the substrate is set in a range from 55 to 60° from the normal direction of the film forming surface of the substrate, when depositing the particles generated from the target, which is made of the same elements as those of the polycrystalline thin film, on the polycrystalline substrate.

9. An oxide superconductor element comprising a polycrystalline substrate, a polycrystalline thin film formed by vapor deposition on the film forming surface of the polycrystalline substrate and an oxide superconducting layer formed on the polycrystalline thin film, wherein said polycrystalline thin film consists of crystal grains made of a composite oxide which has a pyrochlore type crystalline structure of a composition represented as either AHfO, A in the formula representing a rare earth element selected from among Y, Yb, Tm, Er, Ho, Dy, Eu, Gd, Sm, Nd, Pr, Ce and La, deposited on the film forming surface of said polycrystalline substrate, while the grain boundary angle between the same crystal axes of different crystal grains along a plane parallel to the film forming surface of the polycrystalline substrate are controlled within 30°.

10. An oxide superconductor element as claimed in claim 9, wherein said oxide superconducting layer is made of an oxide superconducting material having a composition represented as either $A_1Ba_2Cu_3O_{7-X}$ or $A_2Ba_4(Cu_8O_X)$, and A in the formula represents a rare earth element selected from among Y, Yb, Tm, Er, Ho, Dy, Eu, Gd, Sm, Nd, Pr, Ce and La.

11. An oxide superconductor element as claimed in claim 9, wherein said polycrystalline substrate is a heat resistant metal tape.

12. An oxide superconductor element as claimed in claim 9, wherein said oxide superconducting layer is made of a superconducting material of a cubic crystal system.

13. A method of producing an oxide superconductor element comprising a polycrystalline substrate, a polycrystalline thin film formed on the film forming surface of said polycrystalline substrate and an oxide superconducting layer formed on the polycrystalline thin film, with said polycrystalline thin film consisting of crystal grains made of a composite oxide which has a pyrochlore type crystalline structure of a composition represented as either ArO or AHfO, A in the formula representing a rare earth element selected from among Y, Yb, Tm, Er, Ho, Dy, Eu, Gd, Sm, Nd, Pr, Ce and La, and the grain boundary misalignment angle between the same crystal axes of different crystal grains along a plane parallel to the film forming surface of said polycrystalline substrate being controlled within 30°, wherein the polycrystalline substrate is heated to a temperature not higher than 300° C. and an ion beam of $Ar^+$, $Kr^+$, or $Xe^+$, or a mixed beam of these ions is generated from an ion source with the energy of the ion beam being set in a range from 150 eV to 300 eV, while the incident angle of the ion beam irradiating the film forming surface of the substrate is set in a range from 50 to 60° from the normal direction of the film forming surface of the substrate, when vapor-depositing the particles generated from a target, which is made of the same elements as those of the polycrystalline thin film, on the polycrystalline substrate, and then the oxide superconducting layer is formed on the polycrystalline thin film.

14. A polycrystalline thin film as claimed in claim 1, wherein said crystal grains are made of $Sm_2Zr_2O_7$ or $Gd_2Zr_2O_7$.

15. A polycrystalline thin film as claimed in claim 1, wherein said crystal grains are made of $Gd_2Zr_2O_7$.

16. A polycrystalline thin film as claimed in claim 1, wherein said crystal grains are made of $Eu_2Zr_2O_7$ or $Y_2Zr_2O_7$.

17. A polycrystalline thin film as claimed in claim 1, wherein said polycrystalline substrate is made of silver, platinum, stainless steel, copper, Ni alloy, glass, or ceramics.

18. A polycrystalline thin film as claimed in claim 1, wherein said polycrystalline substrate is made of stainless steel.

19. A polycrystalline thin film as claimed in claim 1, wherein said polycrystalline substrate is made of Hastelloy.

20. A polycrystalline thin film as claimed in claim 1, wherein said polycrystalline thin film is vapor-deposited by sputtering.

21. A polycrystalline thin film as claimed in claim 1, wherein the grain boundary misalignment angle of said polycrystalline thin film is within 15 to 25°.

22. An oxide superconductor element as claimed in claim 9, wherein said crystal grains are made of $Sm_2Zr_2O_7$ or $Gd_2Zr_2O_7$.

23. An oxide superconductor element as claimed in claim 9, wherein said crystal grains are made of $Gd_2Zr_2O_7$.

24. An oxide superconductor element as claimed in claim 9, wherein said crystal grains are made of $Eu_2Zr_2O_7$ or $Y_2Zr_2O_7$.

25. An oxide superconductor element as claimed in claim 9, wherein said polycrystalline substrate is made of silver, platinum, stainless steel, copper, Ni alloy, glass, or ceramics.

26. An oxide superconductor element as claimed in claim 9, wherein said polycrystalline substrate is made of stainless steel.

27. An oxide superconductor element as claimed in claim 9, wherein said polycrystalline substrate is made of Hastelloy.

28. An oxide superconductor element as claimed in claim 9, wherein said polycrystalline thin film is vapor-deposited by sputtering.

29. An oxide superconductor element as claimed in claim 9, wherein said oxide superconducting layer is made of $Y_1Ba_2Cu_3O_{7-X}$, $Y_2Ba_4Cu_8O_X$, $Y_3Ba_3Cu_6O_X$, $(Bi,Pb)_2Ca_2Sr_2Cu_3O_X$, $(Bi, Pb)_2Ca_2Sr_3Cu_4O_X$, $Tl_2Ba_2Ca_2Cu_3O_X$, $Tl_1Ba_2Ca_2Cu_3O_X$, or $Tl_1Ba_2Ca_3Cu_4O_X$.

30. An oxide superconductor element as claimed in claim 9, wherein the grain boundary misalignment angle of said polycrystalline thin film is within 15 to 25°.

31. A method of producing a polycrystalline thin film, comprising:

providing a target made of $Sm_2Zr_2O_7$ or $Gd_2Zr_2O_7$;

heating a polycrystalline substrate to a temperature not higher than 300° C.; and depositing particles generated from the target on a film forming surface of the heated polycrystalline substrate while irradiating the film forming surface with an ion beam of at least one of $Ar^+$, $Kr^+$, and $Xe^+$ which has an energy of 150 eV to 300 eV;

wherein an incident angle of the ion beam irradiating the film forming surface is set within 50 to 60° with respect to the normal direction of the film forming surface.

* * * * *